United States Patent
Mitani et al.

(10) Patent No.: US 11,735,120 B2
(45) Date of Patent: Aug. 22, 2023

(54) SCANNING-LINE DRIVING CIRCUIT AND DISPLAY DEVICE PROVIDED WITH SAME

(71) Applicant: Sharp Kabushiki Kaisha, Sakai (JP)

(72) Inventors: Masahiro Mitani, Sakai (JP); Makoto Yokoyama, Sakai (JP); Naoki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/908,003

(22) PCT Filed: Mar. 2, 2020

(86) PCT No.: PCT/JP2020/008640
§ 371 (c)(1),
(2) Date: Aug. 30, 2022

(87) PCT Pub. No.: WO2021/176504
PCT Pub. Date: Sep. 10, 2021

(65) Prior Publication Data
US 2023/0112313 A1    Apr. 13, 2023

(51) Int. Cl.
*G09G 3/3266* (2016.01)
*G09G 3/325* (2016.01)
*G09G 3/3291* (2016.01)

(52) U.S. Cl.
CPC .......... *G09G 3/3266* (2013.01); *G09G 3/325* (2013.01); *G09G 3/3291* (2013.01); *G09G 2300/0426* (2013.01)

(58) Field of Classification Search
CPC .......................... G09G 3/3677; G09G 3/3266
See application file for complete search history.

(56) References Cited

U.S. PATENT DOCUMENTS

| 5,030,852 A * | 7/1991 | Higashisaka | H03K 19/0952 |
| | | | 326/116 |
| 2015/0179277 A1* | 6/2015 | Pai | G09G 3/20 |
| | | | 377/68 |

(Continued)

FOREIGN PATENT DOCUMENTS

| WO | 2016/175117 A1 | 11/2016 |
| WO | 2016/190187 A1 | 12/2016 |

*Primary Examiner* — Sepehr Azari
(74) *Attorney, Agent, or Firm* — Keating & Bennett, LLP

(57) ABSTRACT

Provided is a scanning-line driving circuit configured with a plurality of unit circuits cascaded in stages and integrally formed with a display panel. The unit circuit includes a first transistor, a resistor, a second transistor, and an output transistor. The first transistor has a first conductive electrode supplied with a first-level voltage and a second conductive electrode connected to a first node. The resistor is connected to the first node at a first terminal. The second transistor has a first conductive electrode supplied with a second-level voltage and a second conductive electrode connected to a second terminal of the resistor. The output transistor has a control electrode connected to the first node and a first conductive electrode connected to an output terminal. The resistor is formed in a semiconductor layer. The unit circuit further includes an upper electrode formed above the resistor. This configuration allows the scanning-line driving circuit to prevent an operation failure due to a change in characteristics of the resistor in the unit circuit.

18 Claims, 23 Drawing Sheets

(56) References Cited

U.S. PATENT DOCUMENTS

| | | | | |
|---|---|---|---|---|
| 2018/0137831 A1* | 5/2018 | Murakami | ............. | G11C 19/28 |
| 2018/0149911 A1* | 5/2018 | Yamaguchi | ............ | H01L 29/786 |
| 2018/0174545 A1* | 6/2018 | Li | ........................ | G09G 3/3677 |
| 2021/0090513 A1* | 3/2021 | Takahashi | ............. | G09G 3/3696 |
| 2021/0232253 A1* | 7/2021 | Cheng | ................... | G06F 1/3262 |

* cited by examiner

SCANNING-LINE DRIVING CIRCUIT AND DISPLAY DEVICE PROVIDED WITH SAME

TECHNICAL FIELD

The disclosure relates to scanning-line driving circuits, particularly to a scanning-line driving circuit integrally formed with a display panel.

BACKGROUND ART

Organic electroluminescent (hereinafter referred to as "EL") display devices are widely used as thin and light-weight high-quality display devices. A typical organic EL display device includes a display portion, a scanning-line driving circuit, a data-line driving circuit, and an emission-control-line driving circuit. The display portion is provided by forming thin-film transistors (hereinafter referred to as "TFTs") on an organic EL panel. The scanning-line driving circuit is configured with a plurality of unit circuits cascaded in stages. Moreover, the scanning-line driving circuit is integrally formed with the organic EL panel by a practically available technique (monolithic gate driver integration). Note that the scanning line and the scanning-line driving circuit will also be referred to as the gate line and the gate driver, respectively.

In relation to the scanning-line driving circuit integrally formed with the organic EL panel, various known unit circuits are known. FIG. 24 is a circuit diagram for a unit circuit in a known scanning-line driving circuit. The unit circuit 91 shown in FIG. 24 includes a ratio circuit including TFTs Q1 and Q5 and a resistor R9. The unit circuit 91 performs a SET operation for setting a node n9 at a high-level voltage and a RESET operation for setting the node n9 at a low-level voltage.

The TFTs Q1 and Q5 are turned on when an input signal IN and a clock signal CK1 are at low level. At this time, the node n9 is supplied with a high-level voltage VGH via the TFT Q1, and is also supplied with a low-level voltage VGL via the TFT Q5 and the resistor R9. The resistor R9 has a resistance value sufficiently higher than an on-resistance value of the TFT Q1, and therefore the node n9 is set at the high-level voltage. In this manner, the unit circuit 91 performs the SET operation when the input signal IN and the clock signal CK1 are at low level.

When the input signal IN is at high level and the clock signal CK1 is at low level, the TFT Q1 is turned off, and the TFT Q5 is turned on. At this time, the node n9 is supplied with the low-level voltage VGL via the TFT Q5 and the resistor R9, and therefore the node n9 is set at the low-level voltage. In this manner, the unit circuit 91 performs the RESET operation when the input signal IN is at high level and the clock signal CK1 is at low level.

For high-speed SET and RESET operations, the resistor R9 has a high resistance value of from several hundred KΩ to several MΩ. In the case where the scanning-line driving circuit is integrally formed with the organic EL panel, the unit circuits 91, along with pixel circuits included in the display portion, are formed with P-channel TFTs. In this case, the resistor R9 is formed with a P-type semiconductor having a high resistance value. Scanning-line driving circuits that include unit circuits incorporating ratio circuits are described in, for example, Patent Documents 1 and 2.

CITATION LIST

Patent Documents

Patent Document 1: WO 2016/175117
Patent Document 2: WO 2016/190187

SUMMARY

Technical Problem

However, in the case of the above known scanning-line driving circuit, the resistor R9 increases in resistance value over time. As the resistor R9 increases in resistance value, more time is required for the voltage at the node n9 to decrease. Accordingly, when the unit circuit 91 performs the RESET operation, the voltage at the node n9 might not decrease to low level within a desired period of time (this phenomenon will be referred to below as a reset failure). When the scanning-line driving circuit experiences a reset failure, there might occur a display failure such as screen flickering.

Therefore, a problem to be solved is to provide a scanning-line driving circuit capable of preventing an operation failure due to a change in characteristics of a resistor in a unit circuit.

Solution to the Problems

The above problem can be solved, for example, by a scanning-line driving circuit configured with a plurality of unit circuits cascaded in stages and integrally formed with a display panel. The unit circuit includes a first transistor, a resistor, a second transistor, and an output transistor. The first transistor has a first conductive electrode supplied with a first-level voltage and a second conductive electrode connected to a first node. The resistor is connected to the first node at a first terminal. The second transistor has a first conductive electrode supplied with a second-level voltage and a second conductive electrode connected to a second terminal of the resistor. The output transistor is connected to the first node at a control electrode and an output terminal at a first conductive electrode. The resistor is formed in the same semiconductor layer as semiconductor portions of the first and second transistors. The unit circuit further includes an upper electrode formed above the resistor.

Effect of the Disclosure

In the scanning-line driving circuit, the upper electrode is formed above the resistor, so that the resistor can be prevented from being affected by electric charge trapped in, for example, an insulating film formed above the resistor, and the resistor can also have a reduced change in characteristics. Thus, the scanning-line driving circuit can prevent an operation failure due to a change in characteristics of the resistor.

DESCRIPTION OF EMBODIMENTS

Hereinafter, scanning-line driving circuits according to embodiments and display devices including the same will be described with reference to the drawings. In the following, m and n are integers of 2 or more, i is an integer from 1 to m, and j is an integer from 1 to n.

First Embodiment

Figure 1:
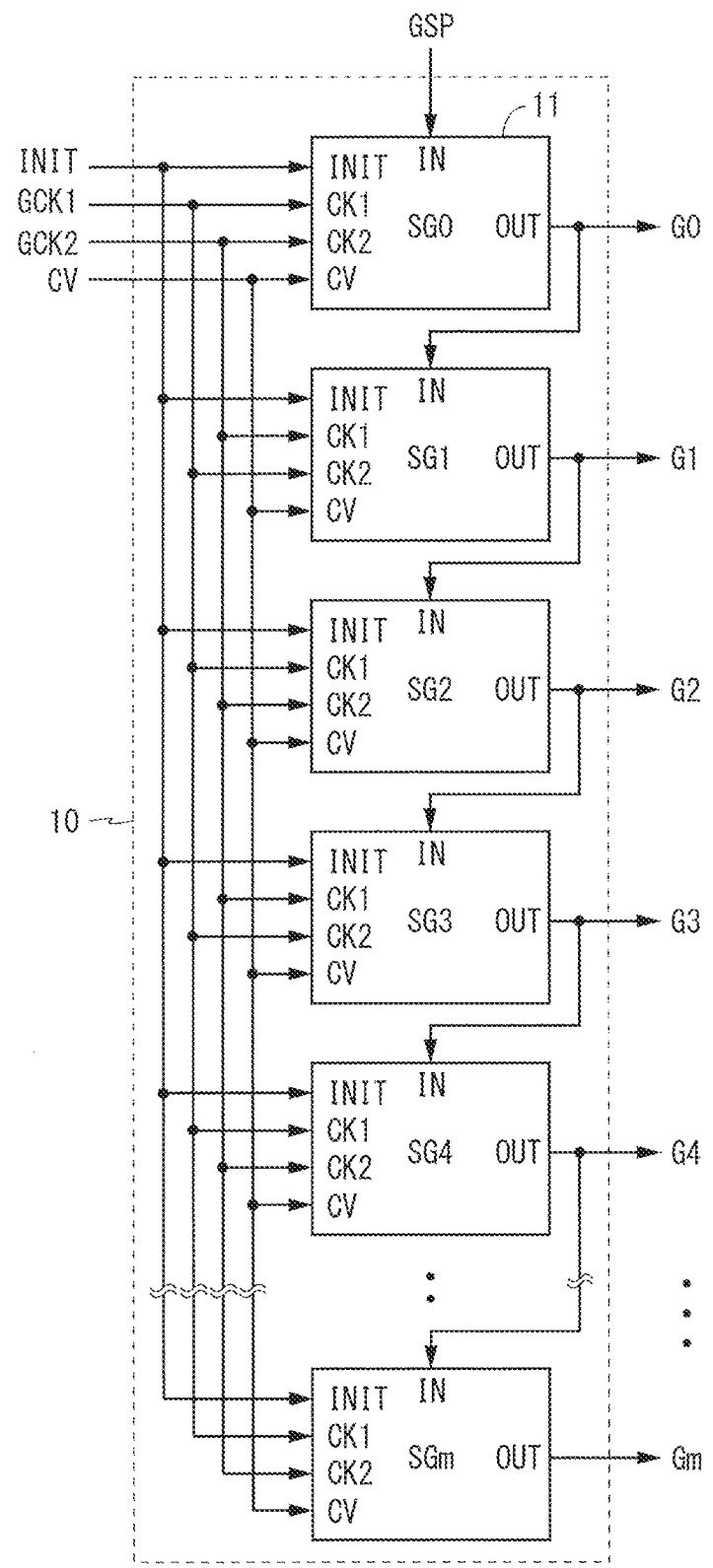
FIG. 1 is a block diagram illustrating the configuration of a scanning-line driving circuit according to a first embodiment.

FIG. 1 is a block diagram illustrating the configuration of a scanning-line driving circuit 10 according to a first embodiment. The scanning-line driving circuit 10 shown in FIG. 1 is configured with (m+1) unit circuits 11 cascaded in stages. Each unit circuit 11 has an initialization terminal INIT, clock terminals CK1 and CK2, an input terminal IN, a control voltage terminal CV, and an output terminal OUT. The unit circuit 11 is supplied with a high-level voltage VGH and a low-level voltage VGL via unillustrated wiring.

Figure 2:
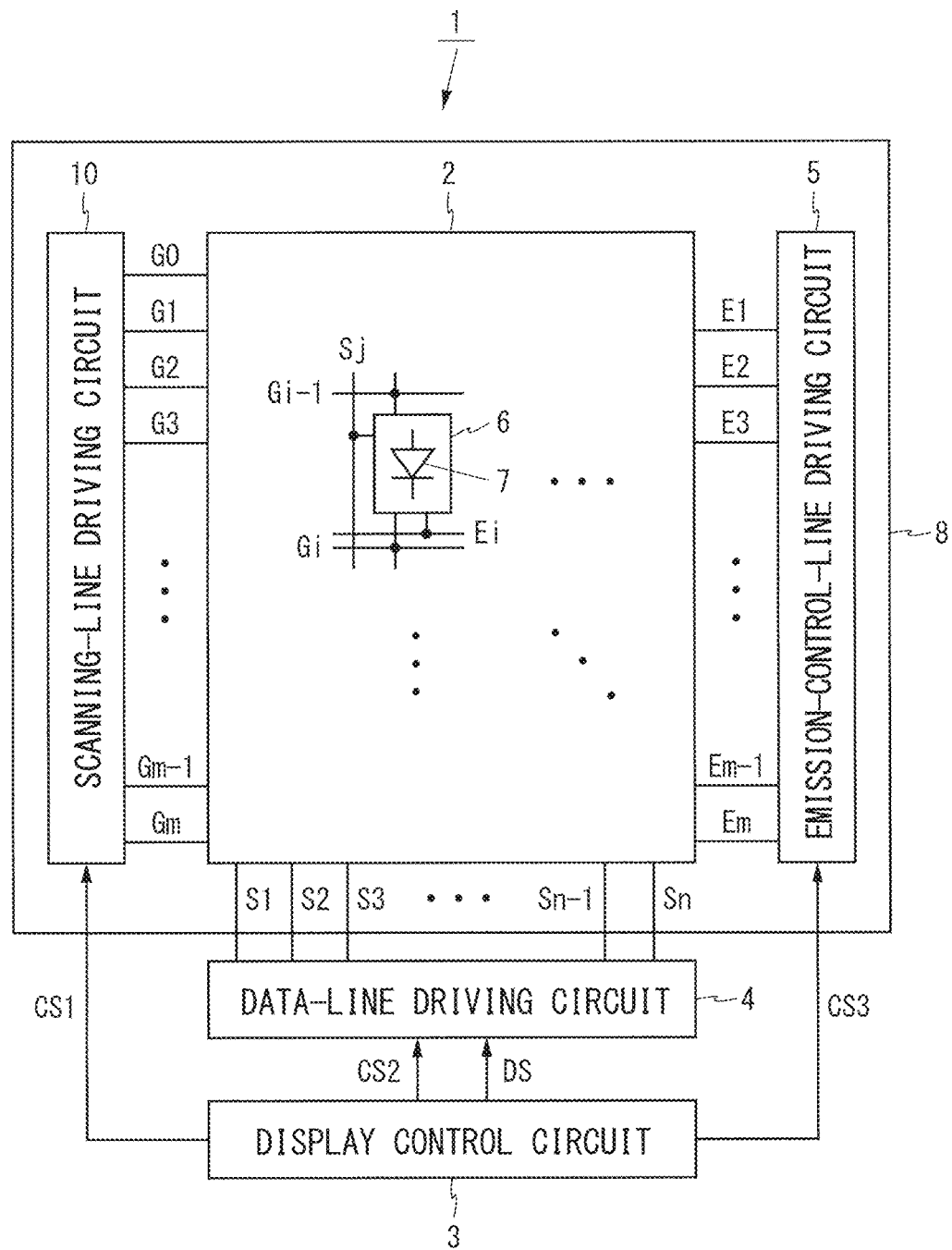
FIG. 2 is a block diagram illustrating the configuration of an organic EL display device including the scanning-line driving circuit shown in FIG. 1.

FIG. 2 is a block diagram illustrating the configuration of an organic EL display device including the scanning-line driving circuit 10. The organic EL display device 1 shown in FIG. 2 includes, in addition to the scanning-line driving circuit 10, a display portion 2, a display control circuit 3, a data-line driving circuit 4, and an emission-control-line driving circuit 5. The display portion 2 is provided by forming TFTs on the organic EL panel 8. The scanning-line driving circuit 10, along with the emission-control-line driving circuit 5, is provided by integrally forming TFTs with the organic EL panel 8. The data-line driving circuit 4 is formed independently of the organic EL panel 8. Note the entirety or a part of the data-line driving circuit 4 may be provided by integrally forming TFTs with the organic EL panel 8, and the entirety or a part of the emission-control-line driving circuit 5 may be formed independently of the organic EL panel 8.

The display portion 2 includes (m+1) scanning lines G0 to Gm, n data lines S1 to Sn, m emission control lines E1 to Em, and (m×n) pixel circuits 6. The scanning lines G0 to Gm are arranged parallel to one another. The emission control lines E1 to Em are arranged parallel to one another. The data lines S1 to Sn are arranged parallel to one another so as to be perpendicular to the scanning lines G0 to Gm. The scanning lines G1 to Gm and the data lines S1 to Sn intersect each other at (m×n) points. The (m×n) pixel circuits 6 are arranged corresponding to the intersection points of the scanning lines G1 to Gm and the data lines S1 to Sn. Each pixel circuit 6 includes an organic EL element 7 as a light-emitting element. The i'th-row, j'th-column pixel circuit 6 is connected to the scanning lines Gi−1 and Gi, the data line Sj, and the emission control line Ei. Note that the i'th-row, j'th-column pixel circuit 6 does not have to be connected to the scanning line Gi−1 and may be connected to another wiring line.

The display control circuit 3 outputs a control signal CS1 to the scanning-line driving circuit 10, a control signal CS2 and video signals DS to the data-line driving circuit 4, and a control signal CS3 to the emission-control-line driving circuit 5. The scanning-line driving circuit 10 drives the scanning lines G0 to Gm in accordance with the control signal CS1. The data-line driving circuit 4 drives the data lines S1 to Sn in accordance with the control signal CS2 and the video signals DS. The emission-control-line driving circuit 5 drives the emission control lines E1 to Em in accordance with the control signal CS3.

More specifically, the scanning-line driving circuit 10 sequentially selects the scanning lines G0 to Gm one by one in accordance with the control signal CS1, and applies a selection voltage (here, a low-level voltage) to the scanning line that is being selected and a non-selection voltage (here, a high-level voltage) to the remaining scanning lines. As a result, during the i'th horizontal period, the (n) pixel circuits 6 in the i'th row are collectively selected. The data-line driving circuit 4 applies n voltages that correspond to the video signals DS to the respective data lines S1 to Sn in accordance with the control signal CS2. As a result, the n voltages are respectively written to the n pixel circuits 6 that are being selected. The organic EL elements 7 in these pixel circuits 6 emit light with respective intensities corresponding to the amounts of current flowing therethrough in accordance with the amounts of voltage written to the pixel circuits 6.

Each row of pixel circuits 6 is assigned emission and non-emission periods. During the emission period for the i'th-row pixel circuits 6, the emission-control-line driving circuit 5 applies an emission voltage (here, a low-level voltage) to the emission control line Ei. During the non-emission period for the i'th-row pixel circuits 6, the emission-control-line driving circuit 5 applies a non-emission voltage (here, a high-level voltage) to the emission control line Ei.

In the following, the (m+1) unit circuits 11 will be referred to in order of connection as the zeroth- to m'th-stage unit circuits. The control signal CS1 outputted to the scanning-line driving circuit 10 by the display control circuit 3 includes an initialization signal INIT, gate clocks GCK1 and GCK2, a gate start pulse GSP, and a control voltage CV. The initialization signal INIT is supplied to the initialization terminal INIT of the unit circuit 11 in each stage. The gate clock GCK1 is supplied to the clock terminals CK1 of the unit circuits 11 in the even stages and the clock terminals CK2 of the unit circuits 11 in the odd stages. The gate clock GCK2 is supplied to the clock terminals CK2 of the unit circuits 11 in the even stages and the clock terminals CK1 of the unit circuits 11 in the odd stages. The gate start pulse GSP is supplied to the input terminal IN of the zeroth-stage unit circuit 11. The control voltage CV is supplied to the control voltage terminal CV of the unit circuit 11 in each stage. The unit circuit 11 in each stage is connected at the output terminal OUT to the input terminal IN of the unit circuit 11 in the next stage and a corresponding one of the scanning lines G0 to Gm.

Figure 3:
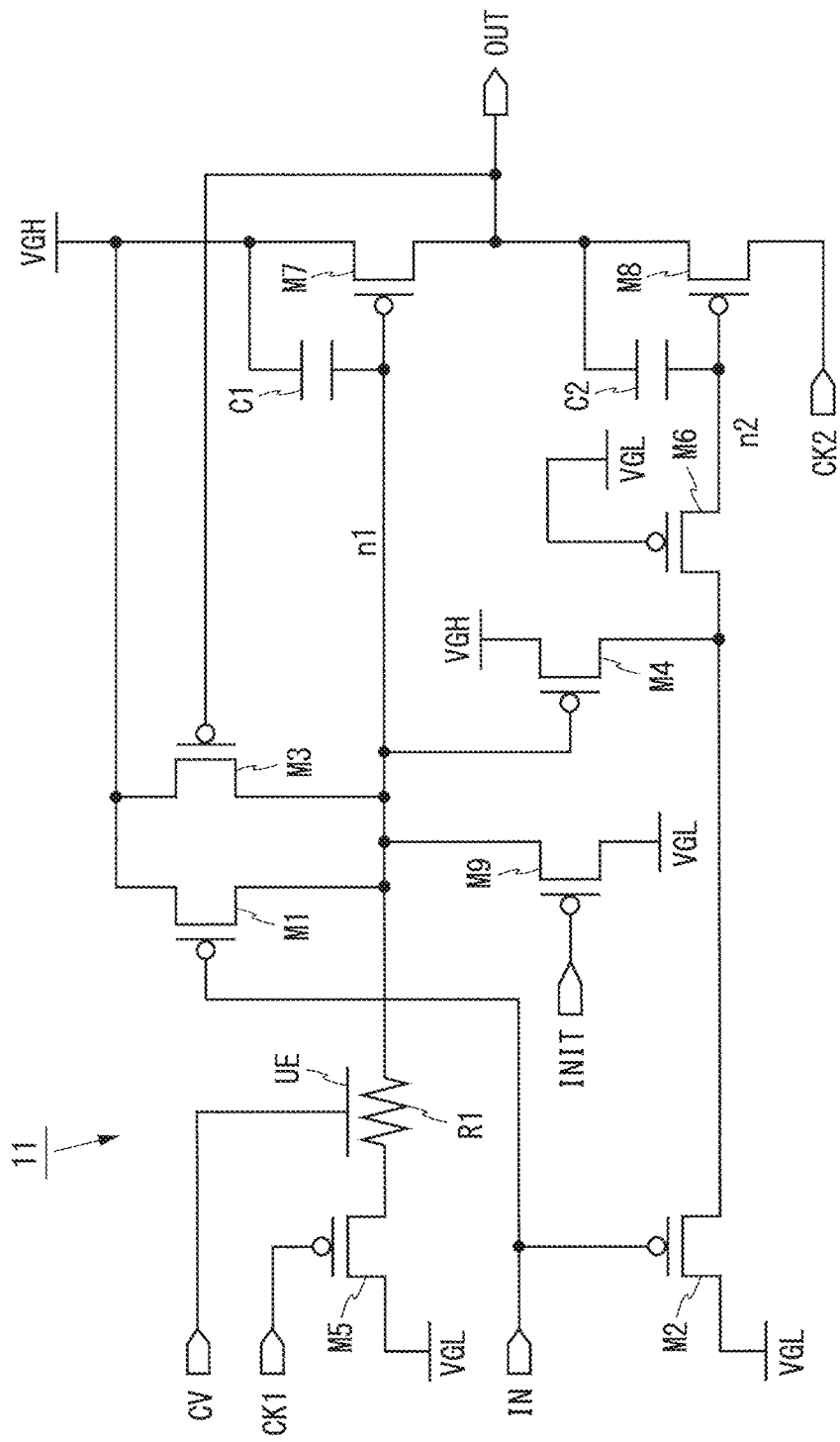
FIG. 3 is a circuit diagram for a unit circuit in the scanning-line driving circuit shown in FIG. 1.

FIG. 3 is a circuit diagram for the unit circuit 11. As shown in FIG. 3, the unit circuit 11 includes nine TFTs M1 to M9, a resistor R1, and two capacitors C1 and C2. The TFTs M1 to M9 are P-channel TFTs. The resistor R1 is formed with a P-type semiconductor (P-type polysilicon) in the same semiconductor layer as semiconductor portions of the TFTs M1 to M9.

The resistor R1 is connected to a node n1 at a first terminal (right in FIG. 3), and the node n1 is also connected to drain electrodes of the TFTs M1 and M3, a source electrode of the TFT M9, and gate electrodes of the TFTs M4 and M7. The resistor R1 is also connected to a source electrode of the TFT M5 at a second terminal. The TFT M6 is connected to a node n2 at a first conductive electrode (right in FIG. 3), and the node n2 is also connected to a gate electrode of the TFT M8. The TFT M6 is also connected at a second conductive electrode to a source electrode of the TFT M2 and a drain electrode of the TFT M4. The TFT M9 is connected to the initialization terminal INIT at a gate electrode. The TFT M5 is connected to the clock terminal CK1 at a gate electrode. The TFT M8 is connected to the clock terminal CK2 at a drain electrode. The TFTs M1 and M2 are connected to the input terminal IN at respective gate electrodes. The TFT M3 is connected to the output terminal OUT at a gate electrode, and the output terminal OUT is also connected to a drain electrode of the TFT M7 and a source electrode of the TFT M8. The TFTs M1, M3, M4, and M7 have respective source electrodes supplied with the high-level voltage VGH. The TFTs M2, M5, and M9 have respective drain electrodes supplied with the low-level voltage VGL, and the TFT M6 also has a gate electrode supplied with the low-level voltage VGL. The capacitor C1 is disposed between the source and gate electrodes of the TFT M7. The capacitor C2 is disposed between the source and gate electrodes of the TFT M8. Formed above the resistor R1 is an upper electrode UE connected to the control voltage terminal CV.

The TFT M1, which has the source electrode supplied with the high-level voltage VGH and the drain electrode connected to the node n1, functions as a first transistor. The first terminal of the resistor R1 is connected to the node n1. The TFT M5, which has the drain electrode supplied with the low-level voltage VGL and the source electrode connected to the second terminal of the resistor R1, functions as a second transistor. The TFTs M1 and M5 and the resistor R1 constitute a ratio circuit. The TFT M7, which is connected to the node n1 at the gate electrode and the output terminal OUT at the drain electrode, functions as an output transistor. The resistor R1 is formed in the same semiconductor layer as the semiconductor portions of the first and second transistors.

The initialization signal INIT is at low level during an initialization period for the scanning-line driving circuit 10 and at high level during other periods. In the initialization period, the TFT M9 is turned on, so that the voltage at the node n1 is initialized to low level. The TFT M9 is off except during the initialization period. The TFT M6 has the gate electrode continuously supplied with the low-level voltage VGL and therefore is always on. Accordingly, the TFTs M6 and M9 do not affect a normal operation of the unit circuit 11.

Figure 4:
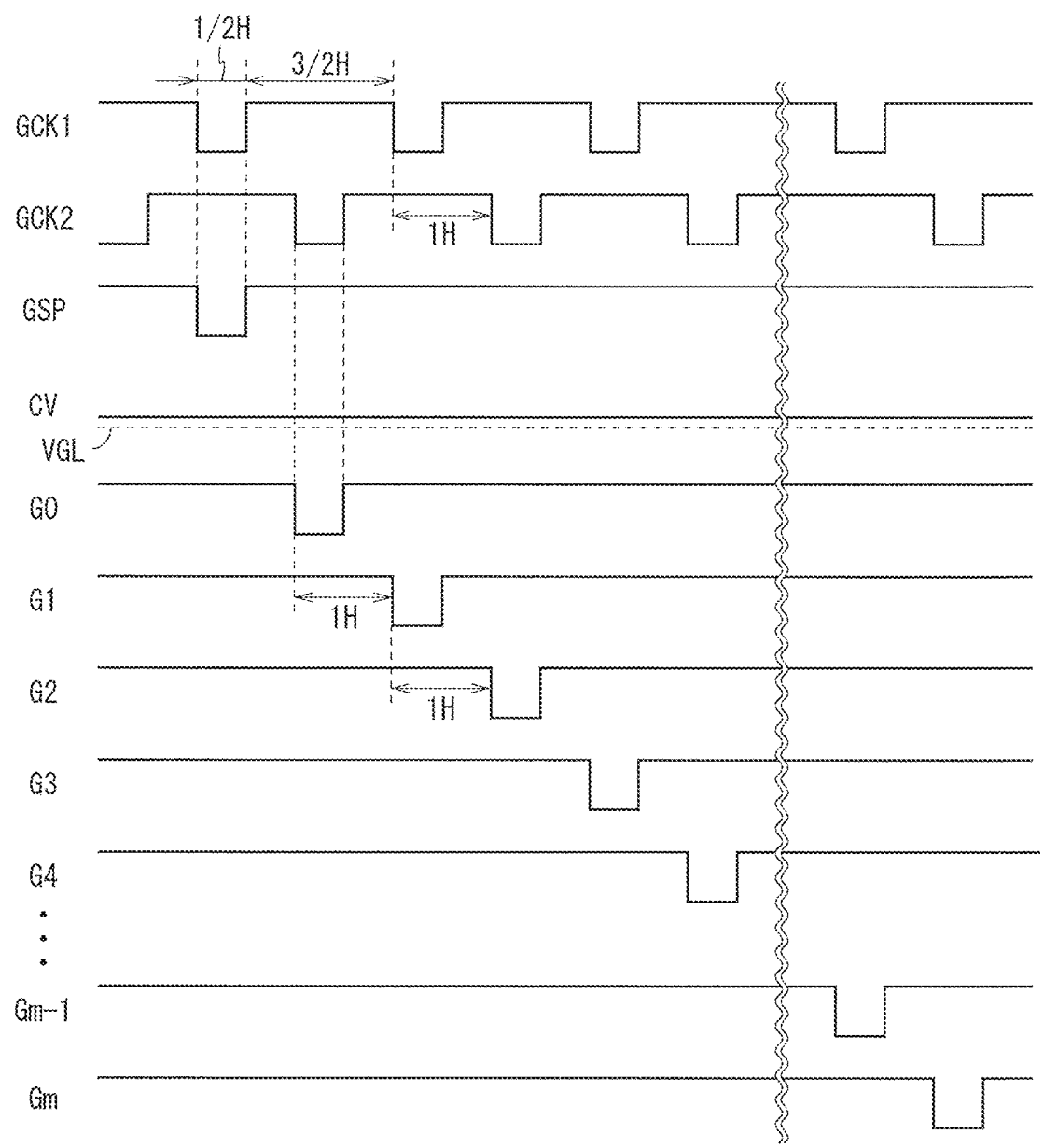
FIG. 4 is a timing chart for the scanning-line driving circuit shown in FIG. 1.

FIG. 4 is a timing chart for the scanning-line driving circuit 10. As shown in FIG. 4, the gate clocks GCK1 and GCK2 are clock signals with a cycle of two horizontal periods (2H). The gate clocks GCK1 and GCK2 have high-level periods whose duration is equal to 3/2 horizontal periods and low-level periods whose duration is equal to a 1/2 horizontal period. The gate clock GCK2 is one horizontal period behind the gate clock GCK1. The gate start pulse GSP becomes low level once per frame period while the gate clock GCK1 is at low level, and the gate start pulse GSP is at high level for the rest of the frame period. The control voltage CV is a fixed negative voltage slightly higher than the low-level voltage VGL. The control voltage CV is applied to the upper electrode UE in the unit circuit 11 in each stage.

Figure 5:
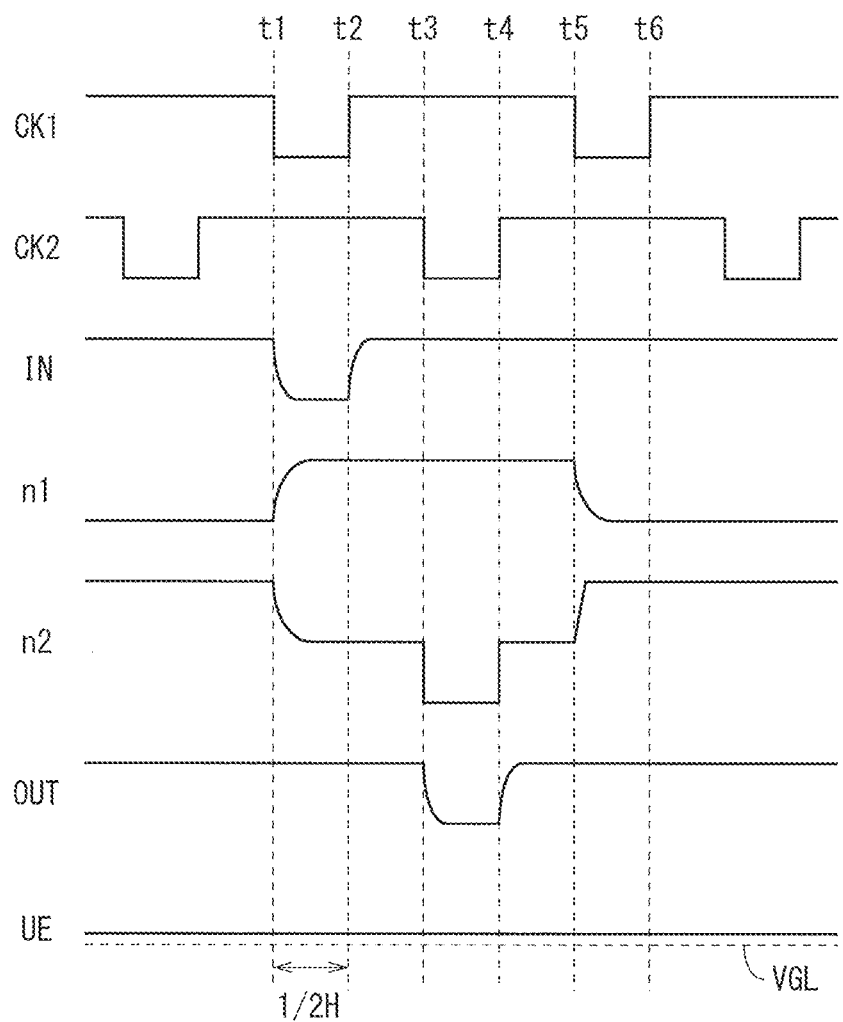
FIG. 5 is a timing chart for the unit circuit shown in FIG. 3.

FIG. 5 is a timing chart for the unit circuit 11. In FIG. 5, times t1 to t6 are set apart at intervals of a half horizontal period. The upper electrode UE has a fixed negative voltage slightly higher than the low-level voltage VGL. Hereinafter, signals inputted to or outputted from a terminal will be referred to by the same name as the terminal. For example, the signal that is inputted to the clock terminal CK1 will be referred to as the clock signal CK1.

Immediately before time t1, the clock signals CK1 and CK2, the input signal IN, the voltage at the node n2, and the output signal OUT are at high level, and the voltage at the node n1 is at low level. Accordingly, the TFTs M1 to M3, M5, and M8 are off, and the TFTs M4 and M7 are on.

At time t1, the clock signal CK1 and the input signal IN transition to low level. Correspondingly, the TFTs M1, M2, and M5 are turned on. The node n1 is supplied with the high-level voltage VGH via the TFT M1 and the low-level voltage VGL via the TFT M5 and the resistor R1. The resistor R1 has a resistance value sufficiently higher than an on-resistance value of the TFT M1. Accordingly, the voltage at the node n1 transitions to high level after time t1, with the result that the TFTs M4 and M7 are turned off. The node n2 is supplied with the low-level voltage VGL via the TFT M2. Accordingly, once the TFT M4 is turned off, the voltage at the node n2 transitions to low level, so that the TFT M8 is turned on. Next, at time t2, the clock signal CK1 and the input signal IN transition to high level. Correspondingly, the TFTs M1, M2, and M5 are turned off.

Next, at time t3, the clock signal CK2 transitions to low level. Since the TFT M8 is on at this time, the output signal OUT transitions to low level. The capacitor C2 is disposed between the gate and source electrodes of the TFT M8. Accordingly, while the output signal OUT is at low level, the voltage at the node n2 is lower than a normal low level. Therefore, the low-level voltage of the output signal OUT is held at the same level as the low-level voltage of the clock signal CK2, rather than increasing by a value equivalent to a threshold voltage of the TFT M8. Once the output signal OUT transitions to low level, the TFT M3 is turned on. While the output signal OUT is at low level, the TFT M3 applies the high-level voltage VGH to the node n1.

Next, at time t4, the clock signal CK2 transitions to high level. Since the TFT M8 is on at this time, the output signal OUT transitions to high level as well. Correspondingly, the voltage at the node n2 transitions to the normal low level, so that the TFT M3 is turned off.

Next, at time t5, the clock signal CK1 transitions to low level. Correspondingly, the TFT M5 is turned on. The node n1 is supplied with the low-level voltage VGL via the TFT M5 and the resistor R1, and therefore the voltage at the node n1 transitions to low level. As a result, the TFTs M4 and M7 are turned on, so that the voltage at the node n2 transitions to high level. Next, at time t6, the clock signal CK1 transitions to high level, so that the TFT M5 is turned off.

In this manner, the unit circuit 11 performs the SET operation to set the node n1 at the high-level voltage when the input signal IN and the clock signal CK1 are at low level. The unit circuit 11 also performs the RESET operation to set the node n1 at the low-level voltage when the input signal IN is at high level and the clock signal CK1 is at low level. The voltage at the node n1 transitions to high level after time t1 at which the input signal IN and the clock signal CK1 transition to low level. Also, the voltage at the node n1 transitions to low level after time t5 at which the clock signal CK1 transitions to low level while the input signal IN is at high level. During the times when the voltage at the node n1 is at low level, the voltage at the node n2 is at high level, and during other times, the voltage at the node n2 is at low level. The output signal OUT transitions to low level one horizontal period after the input signal IN. The output signal OUT remains at low level for a ½ horizontal period.

The zeroth- to m'th-stage unit circuits 11 are respectively connected to the scanning lines G0 to Gm at the output terminals OUT. Accordingly, as shown in FIG. 4, the voltage on the scanning line G0 transitions to low level one horizontal period after the voltage of the gate start pulse GSP, and the scanning line G0 maintains the low-level voltage for a ½ horizontal period. The voltage on the scanning line Gi transitions to low level one horizontal period after the voltage on the scanning line Gi−1, and the scanning line Gi maintains the low-level voltage for a ½ horizontal period. In this manner, the voltages on the scanning lines G0 to Gm transition to low level one after another at intervals of one horizontal period, and each of the scanning lines G0 to Gm maintains the low-level voltage for a ½ horizontal period.

Figure 6:
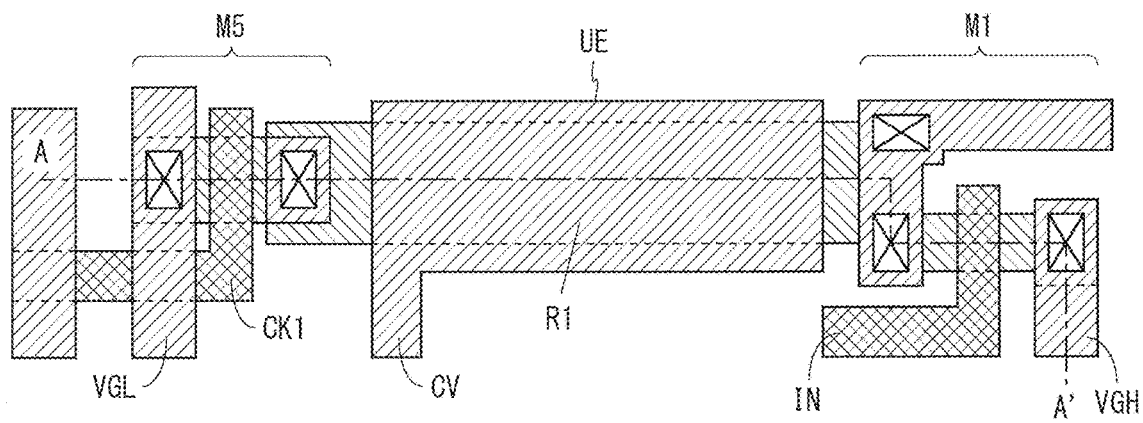
FIG. 6 is a layout diagram illustrating a portion of the unit circuit shown in FIG. 3.

The resistor R1 and the upper electrode UE will be described below. FIG. 6 is a layout diagram illustrating a portion of the unit circuit 11. FIG. 6 shows layout patterns for the TFTs M1 and M5, the resistor R1, and the upper electrode UE. Hereinafter, the wiring layer in which the semiconductor portions of the TFTs M1 to M9 are formed will be referred to as the semiconductor layer, the wiring layer in which the gate electrodes of the TFTs M1 to M9 are formed will be referred to as the gate wiring layer, the wiring layer in which the wiring connected to the source or drain electrodes of the TFTs M1 to M9 is formed will be referred to as the source wiring layer, and the wiring layer in which an anode of the organic EL element 7 is formed will be referred to as the anode layer. The gate wiring layer is located above the semiconductor layer, the source wiring layer is located above the gate wiring layer, and the anode layer is located above the source wiring layer.

In FIG. 6, the area hatched with downward-sloping lines indicates a semiconductor layer pattern, the cross-hatched area indicates a gate wiring layer pattern, the area hatched with upward-sloping lines indicates a source wiring layer pattern, and the rectangles with crosses indicate contact holes through which the semiconductor layer and the source wiring layer are electrically connected. Note that for the sake of easy understanding, FIG. 6 includes no patterns for layers other than the semiconductor layer, the gate wiring layer, and the source wiring layer, and each pattern has a label provided adjacent thereto and showing the name of a voltage applied to the pattern or the name of a terminal connected to the pattern.

Figure 7:
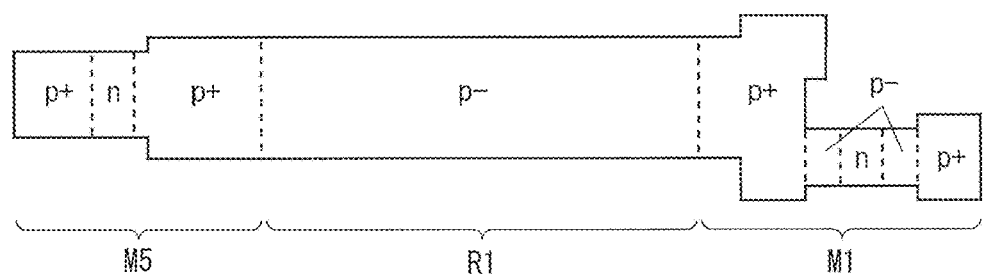
FIG. 7 is a diagram illustrating a semiconductor layer pattern included in the layout diagram shown in FIG. 6.

FIG. 7 is a diagram illustrating the semiconductor layer pattern included in the layout diagram shown in FIG. 6. FIG. 7 shows, from left, a p+ region, an n region, and another p+ region in the position of the TFT M5. Shown in the position of the resistor R1 is a p− region. Shown in the position of the TFT M1, from left, are a p+ region, a p− region, an n region, another p− region, and another p+ region. Note that the p+ regions contain a relatively large amount of P-type impurities, and the p− regions contain a relatively small amount of P-type impurities. The n regions function as channel regions.

Figure 8:
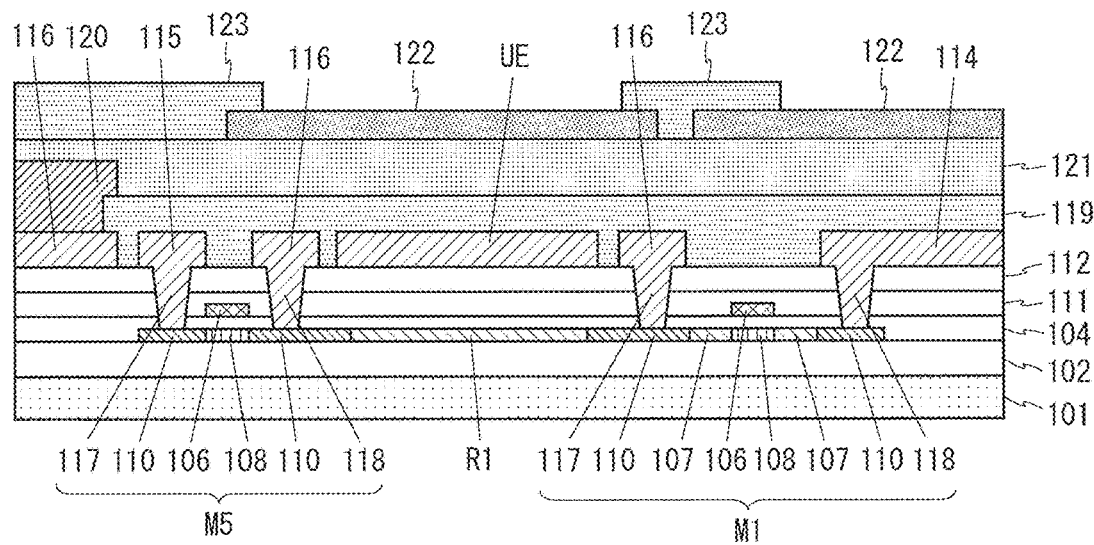
FIG. 8 is a cross-sectional view taken along line A-A' in FIG. 6.

FIG. 8 is a cross-sectional view taken along line A-A' in FIG. 6. As shown in FIG. 8, the upper electrode UE is formed above the resistor R1. The upper electrode UE is located in the source wiring layer. The resistor R1 has a resistance value of, for example, from 0.1 MΩ to 7 MΩ. The resistor R1 and the upper electrode UE are intervened by an insulating film 104 and interlayer insulating films 111 and 112. These insulating films have a combined thickness of, for example, from 200 nm to 1 μm.

Figure 9A:
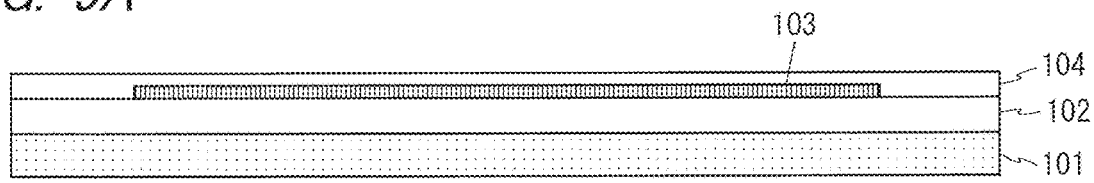
FIG. 9A is a diagram showing a step in the manufacturing process of an organic EL panel including the scanning-line driving circuit shown in FIG. 1.
Figure 9B:
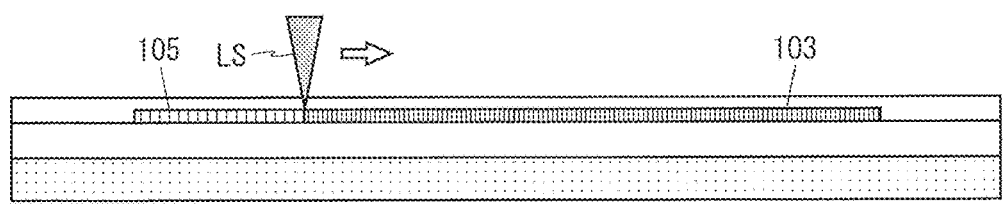
FIG. 9B is a diagram continued from FIG. 9A.
Figure 9C:
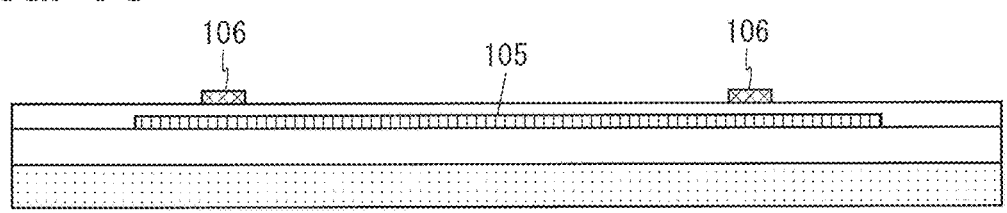
FIG. 9C is a diagram continued from FIG. 9B.
Figure 9D:
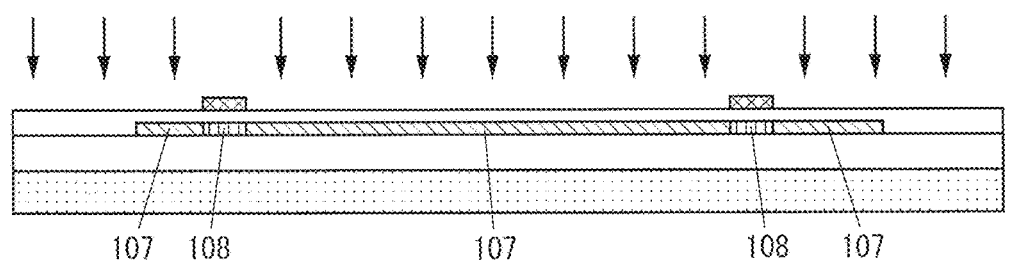
FIG. 9D is a diagram continued from FIG. 9C.

FIGS. 9A to 9M are diagrams showing steps in the manufacturing process of the organic EL panel 8 including the scanning-line driving circuit 10. Initially, a back coat layer 102 is deposited on a polyimide substrate 101, amorphous silicon 103 is deposited in a position in which to form a semiconductor layer pattern, and an insulating film 104 is formed with silicon dioxide ($SiO_2$) (FIG. 9A). Next, the amorphous silicon 103 on the substrate is exposed to excimer laser irradiation LS sequentially from one side to the other, thereby reforming the amorphous silicon 103 into polysilicon 105 (FIG. 9B). Next, gate electrodes 106 for TFTs are formed with molybdenum in positions where the TFTs are to be formed (FIG. 9C). Next, boron ion irradiation is performed so as to implant boron into the polysilicon 105 on the substrate. This step results in forming p− regions 107 in positions where the polysilicon 105 on the substrate is not covered by the gate electrodes 106 and also forming n regions 108 in positions where the polysilicon 105 is covered by the gate electrodes 106 (FIG. 9D).

Figure 9E:
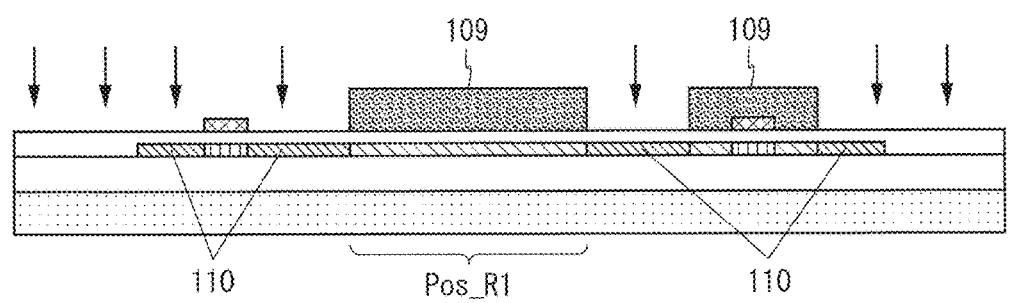
FIG. 9E is a diagram continued from FIG. 9D.
Figure 9F:
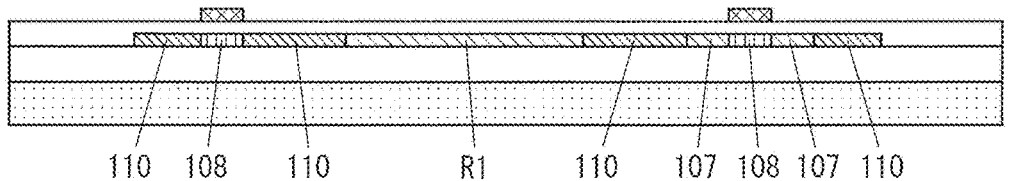
FIG. 9F is a diagram continued from FIG. 9E.
Figure 9G:
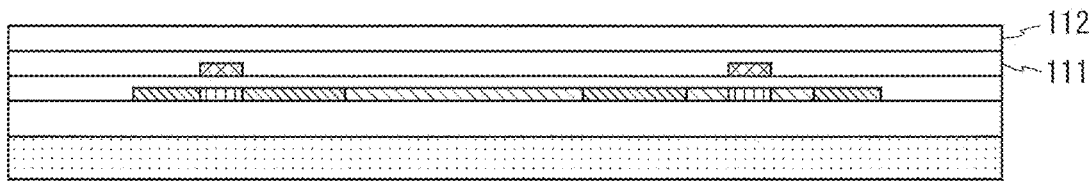
FIG. 9G is a diagram continued from FIG. 9F.
Figure 9H:
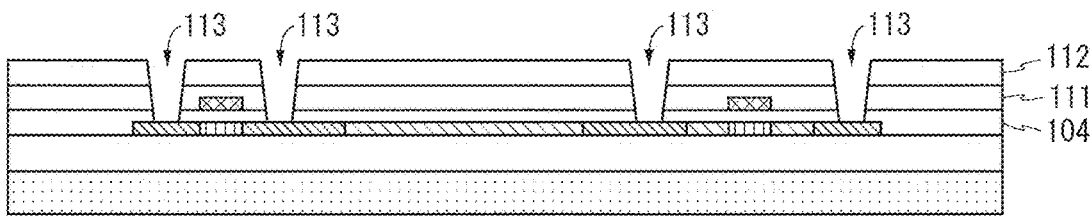
FIG. 9H is a diagram continued from FIG. 9G.

Next, a resist 109 is applied to some positions, including position Pos_R1 where a resistor R1 is to be formed, and boron ion irradiation is performed again. As a result of this step, the portions of the p− regions 107 that are not covered by the resist 109 are transformed to p+ regions 110 (FIG. 9E). Next, the resist 109 is removed (FIG. 9F). The p− region 107 in position Pos_R1 serves as the resistor R1 for the manufactured organic EL panel 8. Next, an interlayer insulating film 111 is formed with silicon nitride ($SiN_x$), and an interlayer insulating film 112 is formed with silicon nitride and silicon oxide ($SiO_x$) (FIG. 9G). Next, contact holes 113 are opened through the insulating film 104 and the interlayer insulating films 111 and 112 in positions where drain and source electrodes of the TFTs are to be formed (FIG. 9H).

Figure 9I:
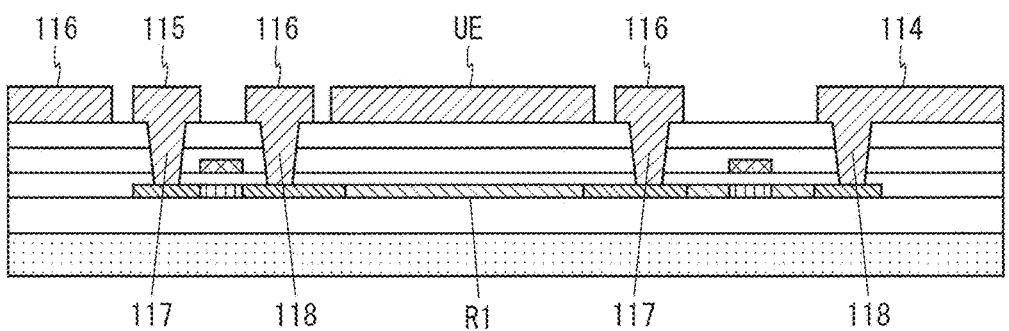
FIG. 9I is a diagram continued from FIG. 9H.

Next, various wiring lines are formed with titanium/aluminum/titanium in predetermined positions on the substrate (FIG. 9I). This step results in forming a wiring line 114 for supplying the high-level voltage VGH, a wiring line 115 for supplying the low-level voltage VGL, wiring lines 116 for connecting the electrodes of the TFTs, etc. Further, the contact holes 113 are filled with the above metal materials, thereby forming the drain and source electrodes 117 and 118 of the TFTs. The drain and source electrodes 117 and 118 electrically connect the p+ regions 110 and the wiring lines 114 to 116. The above step also results in forming an upper electrode UE above the resistor R1 such that the upper electrode UE covers the entire area of the resistor R1.

Figure 9J:
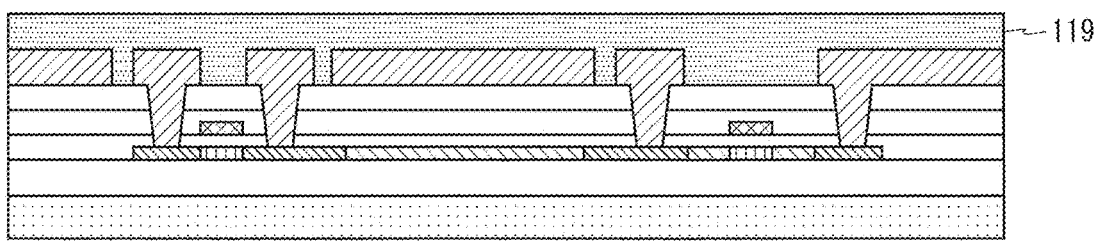
FIG. 9J is a diagram continued from FIG. 9I.
Figure 9K:
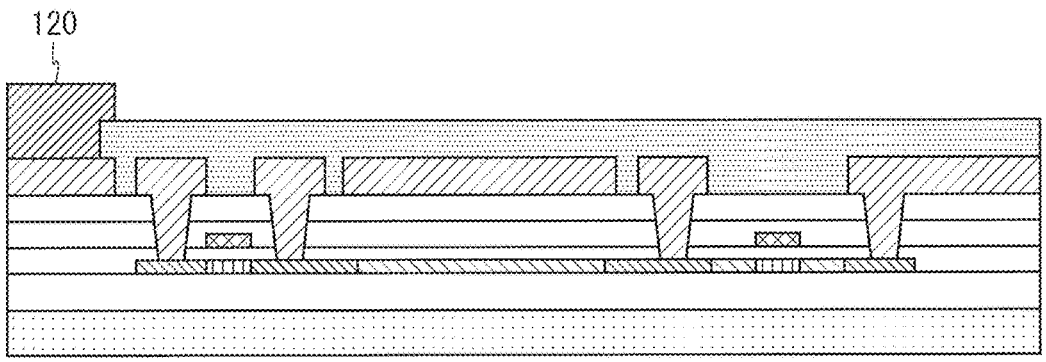
FIG. 9K is a diagram continued from FIG. 9J.
Figure 9L:
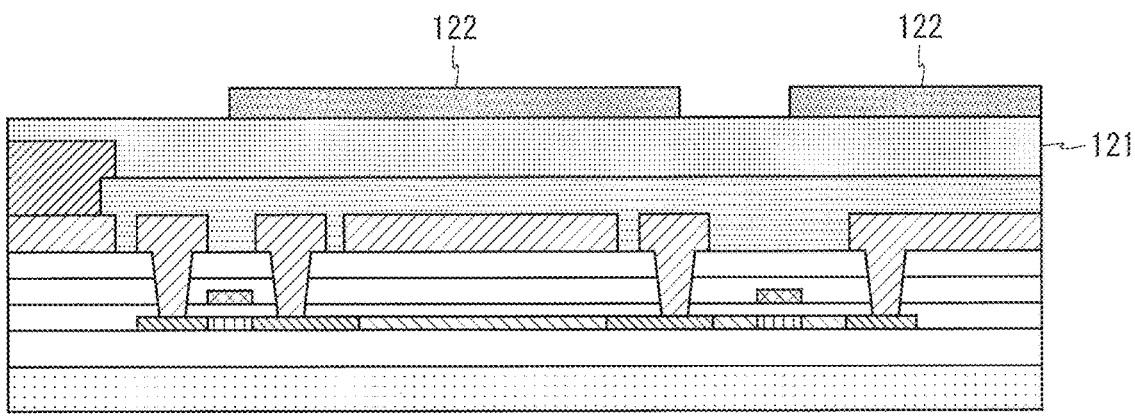
FIG. 9L is a diagram continued from FIG. 9K.
Figure 9M:
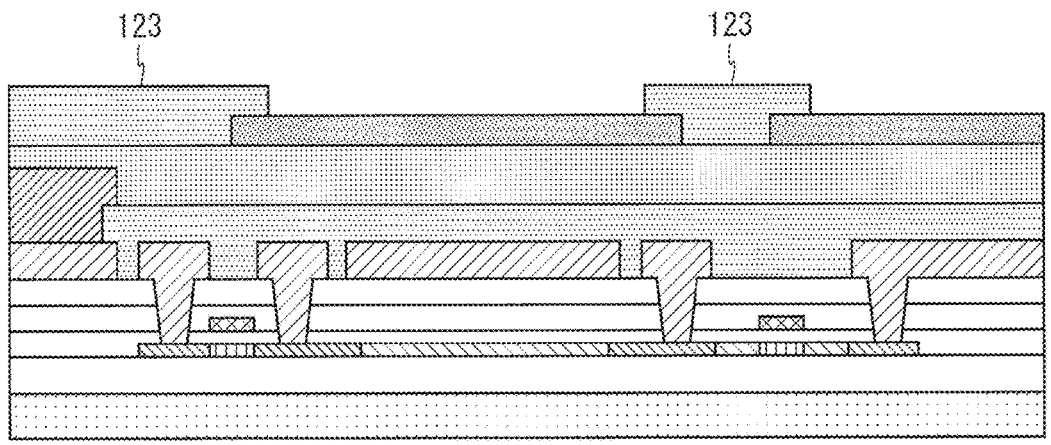
FIG. 9M is a diagram continued from FIG. 9L.

Next, a planarizing film 119 is formed with polyimide (FIG. 9J). Next, a through hole is opened in a predetermined position on the substrate, and a wiring line 120 is formed with titanium/aluminum/titanium in the predetermined position (FIG. 9K). Next, a planarizing film 121 is formed with polyimide, and anodes 122 are formed with silver in predetermined positions on the substrate (FIG. 9L). Next, banks 123 are formed with polyimide in predetermined positions on the substrate (FIG. 9M).

The above steps result in the substrate shown in FIG. 8. The organic EL panel 8 including the scanning-line driving circuit 10 can be manufactured by sequentially forming an organic EL layer, cathodes, and a sealing film on the substrate shown in FIG. 8. Note that the materials mentioned above are illustrative examples, and materials other than the above may also be used.

Figure 10:
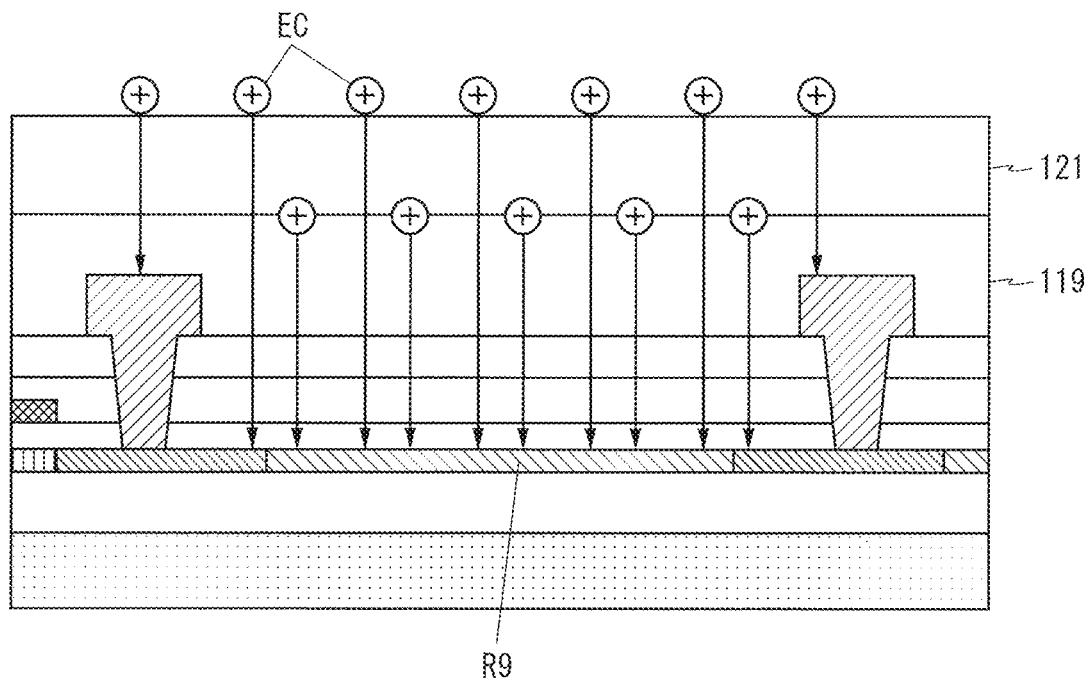
FIG. 10 is a diagram describing problems with a known scanning-line driving circuit.
Figure 11:
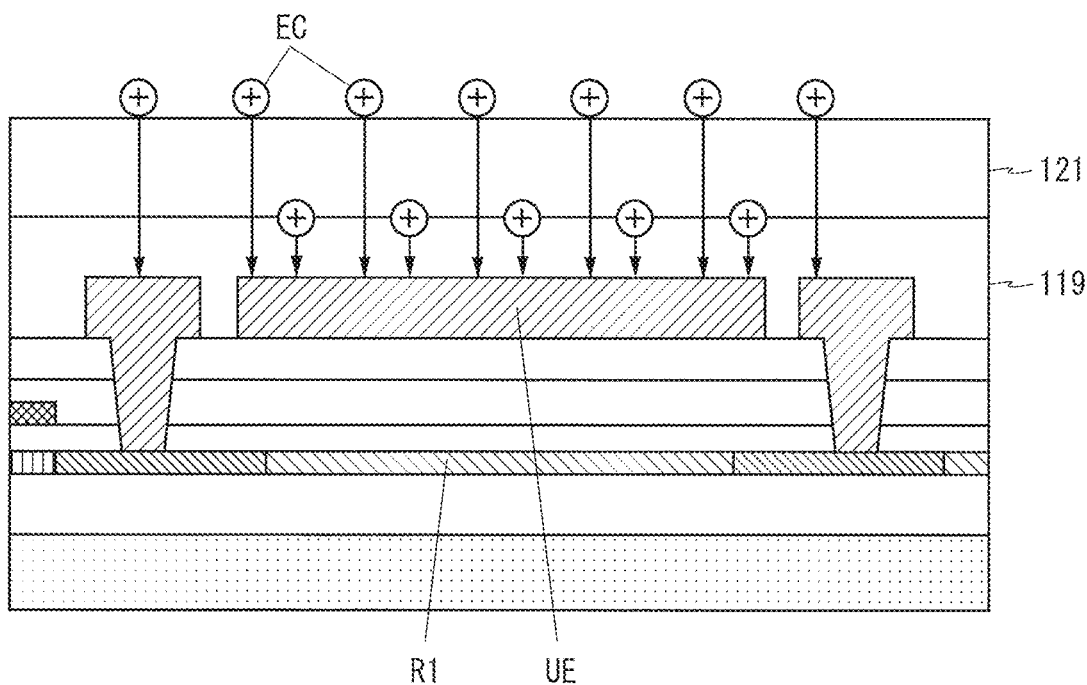
FIG. 11 is a diagram describing effects of the scanning-line driving circuit shown in FIG. 1.
Figure 24:
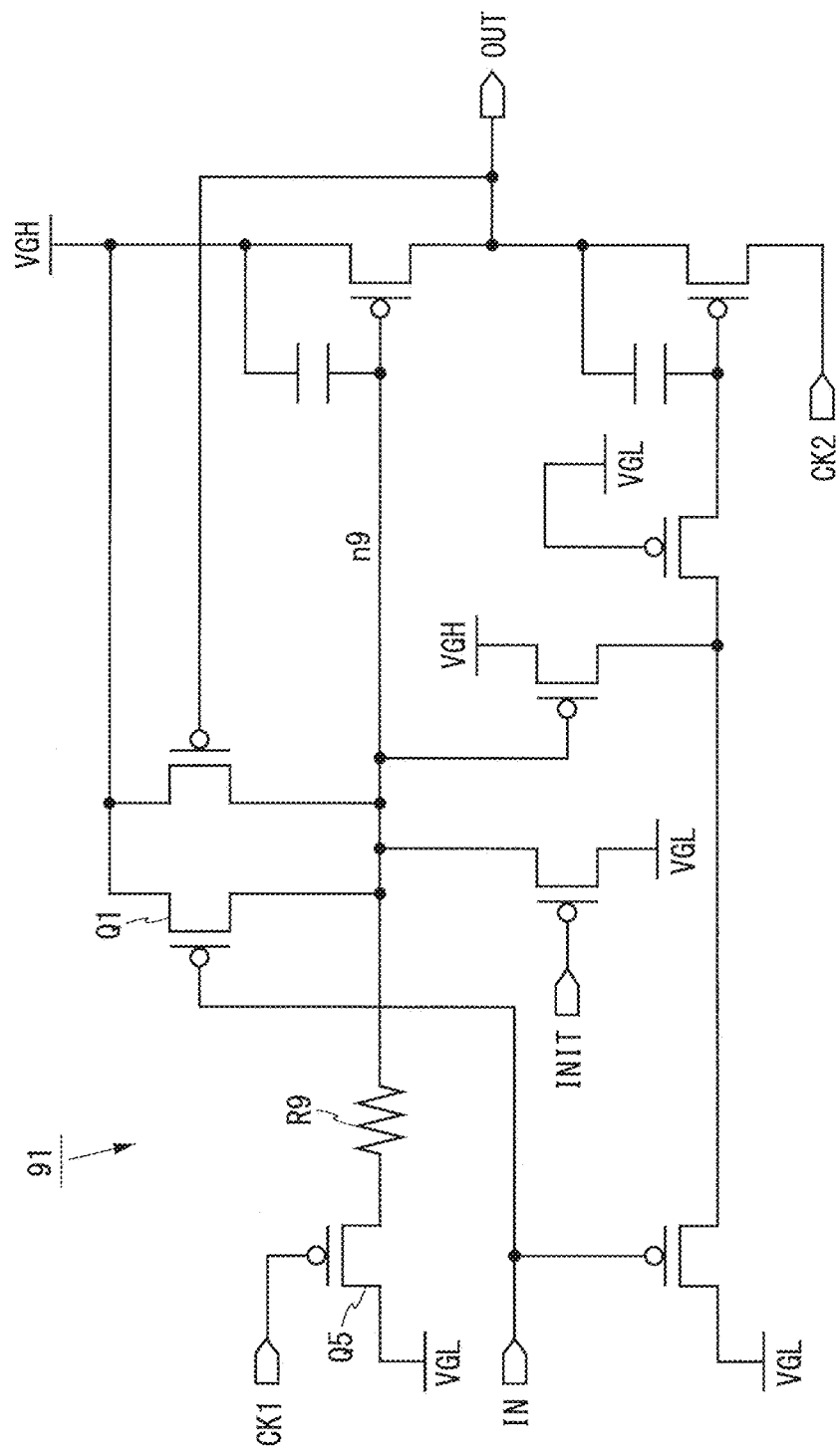
FIG. 24 is a circuit diagram for a unit circuit in a known scanning-line driving circuit.

Effects of the scanning-line driving circuit 10 will be described in comparison to a known scanning-line driving circuit including the unit circuit 91 shown in FIG. 24. FIG. 10 is a diagram describing problems with the known scanning-line driving circuit. FIG. 11 is a diagram describing the effects of the scanning-line driving circuit 10. FIGS. 10 and 11 illustrate cross sections around the resistors in the unit circuits of the scanning-line driving circuits. Note that for easy comparison of the figures, corresponding components are denoted by the same reference characters.

The known scanning-line driving circuit (FIG. 10) has no upper electrode formed above the resistor R9. Accordingly, when electric charge EC is trapped in the insulating films (planarizing films 119 and 121) formed above the resistor R9 and also in the interface therebetween, lines of electric force from the electric charge EC extend to the resistor R9 formed in the semiconductor layer. Accordingly, the concentration of charge carriers induced by the resistor R9 changes, so that the resistor R9 changes in resistance value. The resistor R9 increases in resistance value over time. In the case of the known scanning-line driving circuit, such an increase in the resistance value of the resistor R9 results in a reset failure. As a result, organic EL display devices including such known scanning-line driving circuits experience a display failure such as screen flickering.

On the other hand, the scanning-line driving circuit 10 according to the present embodiment (FIG. 11) has the upper electrode UE formed above the resistor R1. Accordingly, when electric charge EC is trapped in the insulating films formed above the resistor R1 and also in the interface therebetween, lines of electric force from the electric charge EC do not extend to the resistor R1 because of the action of the upper electrode UE. Therefore, the concentration of charge carriers induced by the resistor R1 does not change and neither does the resistance value of the resistor R1. Thus, the scanning-line driving circuit 10 renders it possible to prevent a reset failure due to a change in characteristics of the resistor R1. Moreover, the organic EL display device 1 including the scanning-line driving circuit 10 renders it possible to prevent a display failure such as screen flickering.

In the scanning-line driving circuit 10, the resistor R1 is formed with a P-type semiconductor, and the upper electrode UE is supplied with a fixed negative voltage (control voltage CV). When the upper electrode UE is decreased in voltage, the resistor R1 decreases in resistance value. As the resistor R1 decreases in resistance value, the voltage at the node n1 becomes more likely to change from high to low level. Therefore, the unit circuit 11 can readily perform the RESET operation. Thus, it is possible to more effectively prevent a reset failure due to a change in characteristics of the resistor R1. Moreover, since the upper electrode UE is formed in the source wiring layer, the upper electrode UE and the resistor R1 are not intervened by any organic film susceptible to containing water and electric charge. Thus, the scanning-line driving circuit 10 can operate more stably.

As described above, the scanning-line driving circuit 10 according to the present embodiment is configured with the unit circuits 11 cascaded in stages and integrally formed with the display panel (organic EL panel 8). Each unit circuit 11 includes the first transistor (TFT M1), the resistor R1, the second transistor (TFT M5), and the output transistor (TFT M7). The first transistor has a first conductive electrode (source electrode) supplied with a first-level voltage (high-level voltage VGH) and a second conductive electrode (drain electrode) connected to a first node (node n1). The resistor R1 is connected to the first node at the first terminal. The second transistor has a first conductive electrode (drain electrode) supplied with a second-level voltage (low-level voltage VGL) and a second conductive electrode (source electrode) connected to the second terminal of the resistor R1. The output transistor is connected to the first node at a control electrode (gate electrode) and the output terminal OUT at a first conductive electrode (drain electrode). The resistor R1 is formed in the same semiconductor layer as the semiconductor portions of the first and second transistors, and the upper electrode UE is formed above the resistor R1.

In the scanning-line driving circuit 10, the upper electrode UE is formed above the resistor R1 so that the resistor R1 can be prevented from being affected by electric charge trapped in, for example, the insulating films formed above the resistor R1, and the resistor R1 can also have a reduced change in characteristics. Thus, the scanning-line driving circuit 10 can prevent an operation failure due to a change in characteristics of the resistor R1.

The resistor R1 is formed with a P-type semiconductor (P-type polysilicon). Therefore, the scanning-line driving circuit 10, which include the unit circuits 11 incorporating the resistors R1, can be integrally formed with the display panel. The upper electrode UE is formed in a wiring layer above control electrodes (gate electrodes) of the first and second transistors, specifically, the same wiring layer (source wiring layer) as the wiring lines 114 to 116 connected to the conductive electrodes (source and drain electrodes) of the first and second transistors. Accordingly, the resistor R1 and the upper electrode UE are not intervened by any organic film susceptible to containing water and electric charge, and therefore the scanning-line driving circuit 10 can operate more stably.

The resistor R1 preferably has a resistance value of from 0.1 MΩ to 7 MΩ. Using the resistor R1 having such a resistance value allows the unit circuit 11 to perform the SET and RESET operations at high speed. The resistor R1 and the upper electrode UE are preferably intervened by insulating films (interlayer insulating films 111 and 112) having a thickness of from 200 nm to 1 µm. Providing the insulating films having such a thickness allows the resistor R1 and the upper electrode UE to be properly spaced apart from each other.

The control electrode (gate electrode) of the first transistor receives an output signal OUT from the unit circuit in the immediately preceding stage, and the control electrode of the second transistor receives a clock signal (gate clock GCK1 or GCK2). This renders it possible to turn on the first and second transistors at appropriate times and thereby allow the scanning-line driving circuit 10 to operate correctly.

The upper electrode UE is supplied with a fixed negative voltage (control voltage CV) within the range of, for example, −10V to −5V. Applying such a negative voltage to the upper electrode UE reduces the resistance value of the resistor R1. Therefore, the unit circuit 11 can readily perform the RESET operation.

Figure 12:
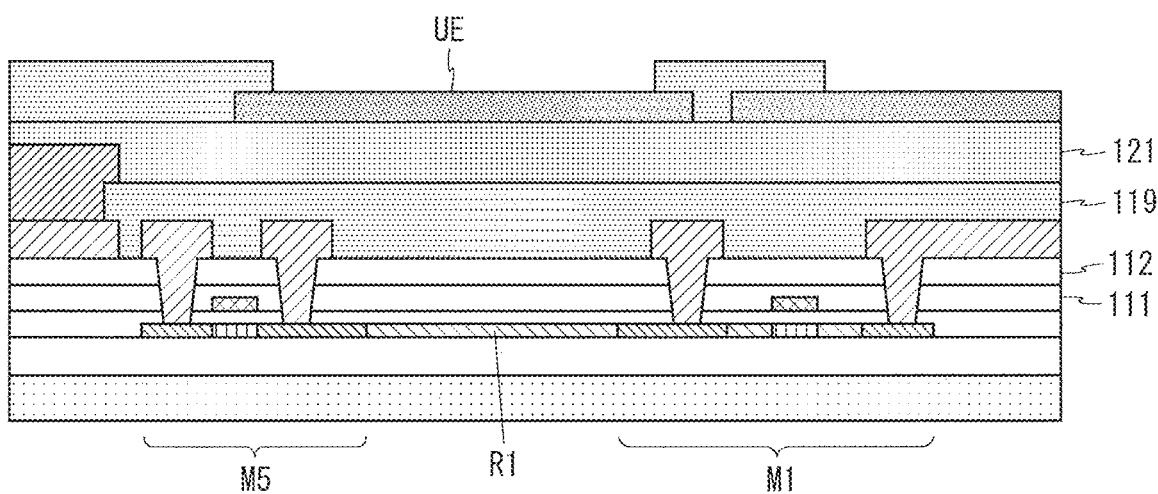
FIG. 12 is a cross-sectional view of a unit circuit in a scanning-line driving circuit according to a variant of the first embodiment.

FIG. 12 is a cross-sectional view of a unit circuit in a scanning-line driving circuit according to a variant of the present embodiment. In the unit circuit shown in FIG. 12, the upper electrode UE is formed in the same wiring layer as the anode 122 of the organic EL element 7 rather than in the source wiring layer. In this case, the resistor R1 and the upper electrode UE are intervened by the following insulating films: the interlayer insulating films 111 and 112 and the planarizing films 119 and 121. The scanning-line driving circuit according to the variant, as with the scanning-line driving circuit 10 according to the first embodiment, can prevent an operation failure due to a change in characteristics of the resistor R1.

Second Embodiment

Figure 13:
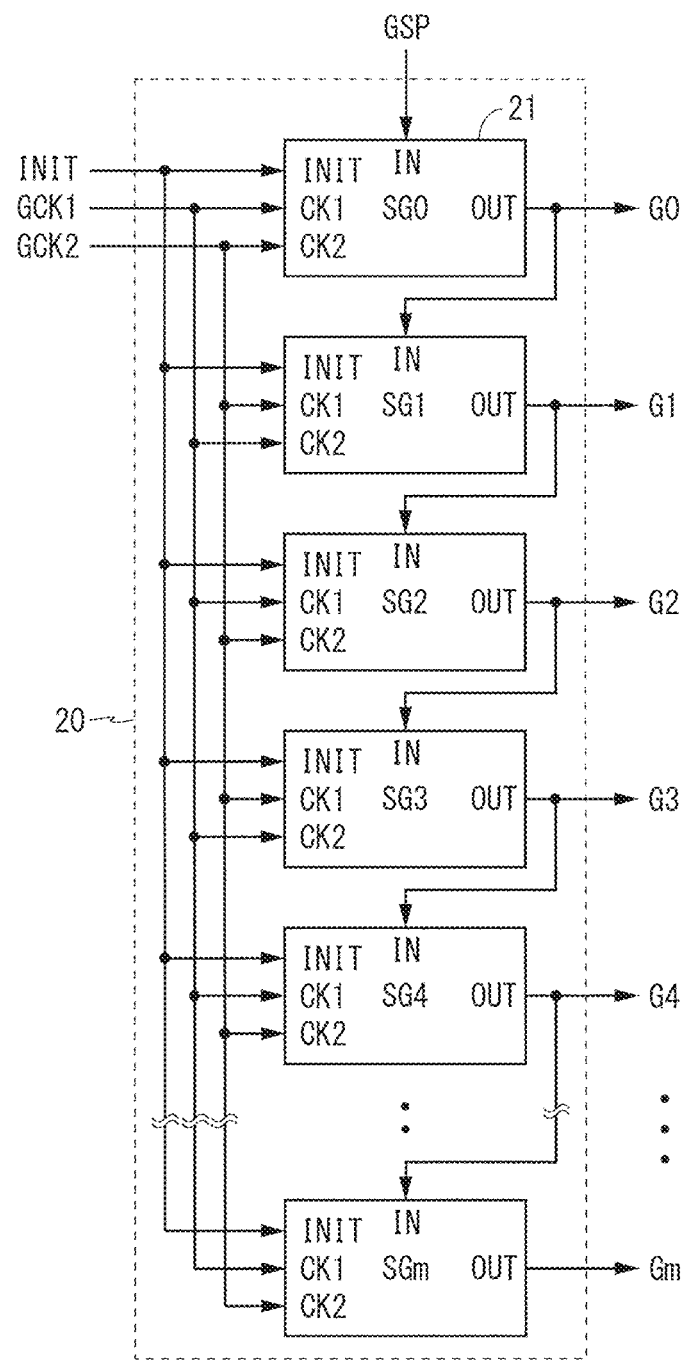
FIG. 13 is a block diagram illustrating the configuration of a scanning-line driving circuit according to a second embodiment.

FIG. 13 is a block diagram illustrating the configuration of a scanning-line driving circuit according to a second embodiment. The scanning-line driving circuit 20 shown in FIG. 13 is configured with (m+1) unit circuits 21 cascaded in stages. Each unit circuit 21 has an initialization terminal INIT, clock terminals CK1 and CK2, an input terminal IN, and an output terminal OUT. Differences from the first embodiment will be described below.

Figure 14:
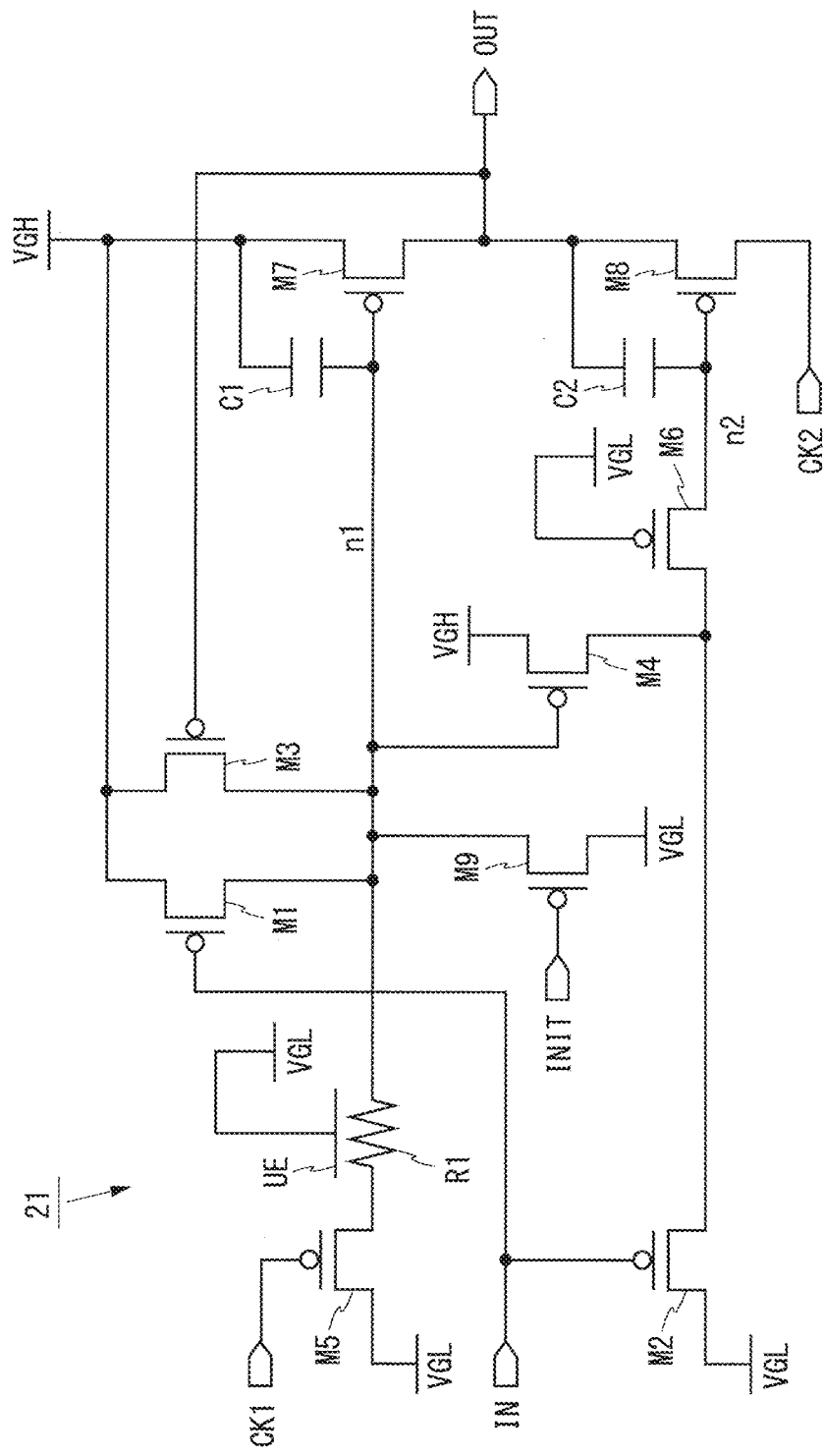
FIG. 14 is a circuit diagram for a unit circuit in the scanning-line driving circuit shown in FIG. 13.
Figure 15:
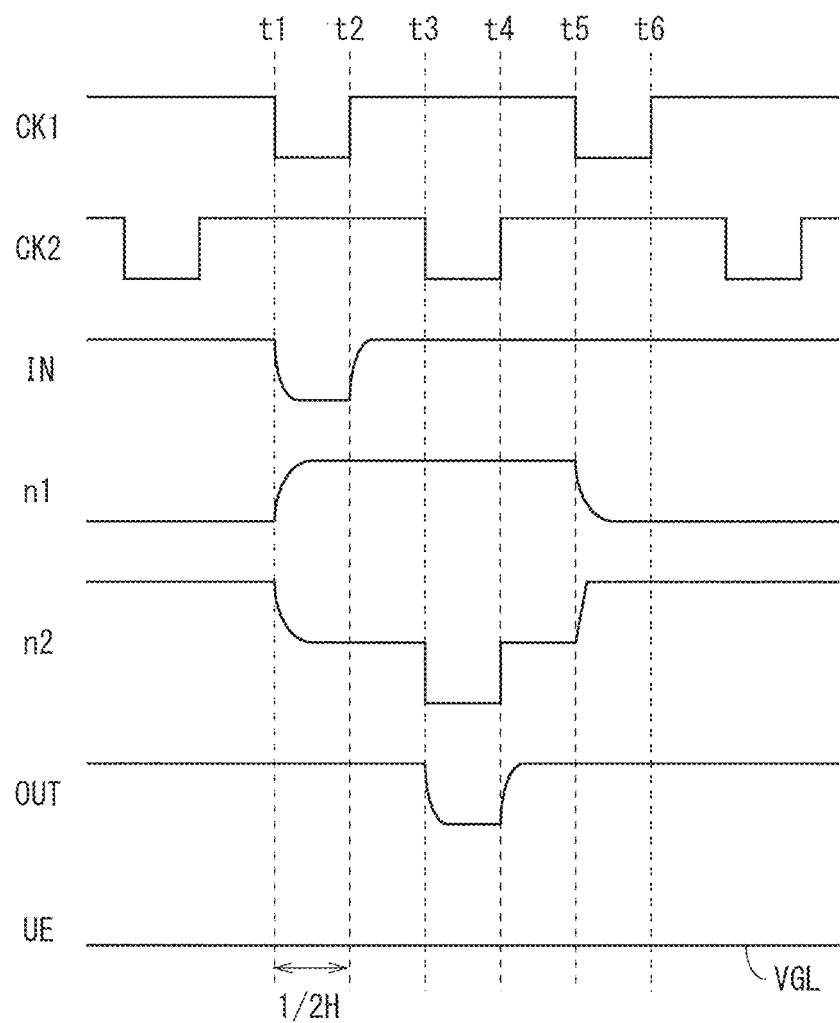
FIG. 15 is a timing chart for the unit circuit shown in FIG. 14.

FIG. 14 is a circuit diagram for the unit circuit 21. In the unit circuit 21, the upper electrode UE formed above the resistor R1 is supplied with the fixed low-level voltage VGL. FIG. 15 is a timing chart for the unit circuit 21. As shown in FIG. 15, the upper electrode UE has a voltage that is always equal to the low-level voltage VGL.

Applying the low-level voltage VGL to the upper electrode UE in the above manner also renders it possible to prevent the resistor R1 from being affected by electric charge trapped in, for example, the insulating films formed above the resistor R1, and allow the resistor R1 to have a reduced change in characteristics. Thus, the scanning-line driving circuit 20 can prevent an operation failure due to a change in characteristics of the resistor R1. Furthermore, the scanning-line driving circuit 20 does not require any wiring line for supplying the control voltage CV.

In the scanning-line driving circuit 20 according to the present embodiment, the upper electrode UE is supplied with a fixed negative voltage equal to the low-level voltage VGL supplied to the unit circuit 21. Even without any wiring line for supplying the control voltage CV, the scanning-line driving circuit 20, as with the scanning-line driving circuit 10 according to the first embodiment, can prevent an operation failure due to a change in characteristics of the resistor R1.

Third Embodiment

In a scanning-line driving circuit according to a third embodiment, the unit circuits 21 in the scanning-line driving circuit 20 according to the second embodiment (FIG. 13) are replaced with different unit circuits. Differences from the second embodiment will be described below.

Figure 16:
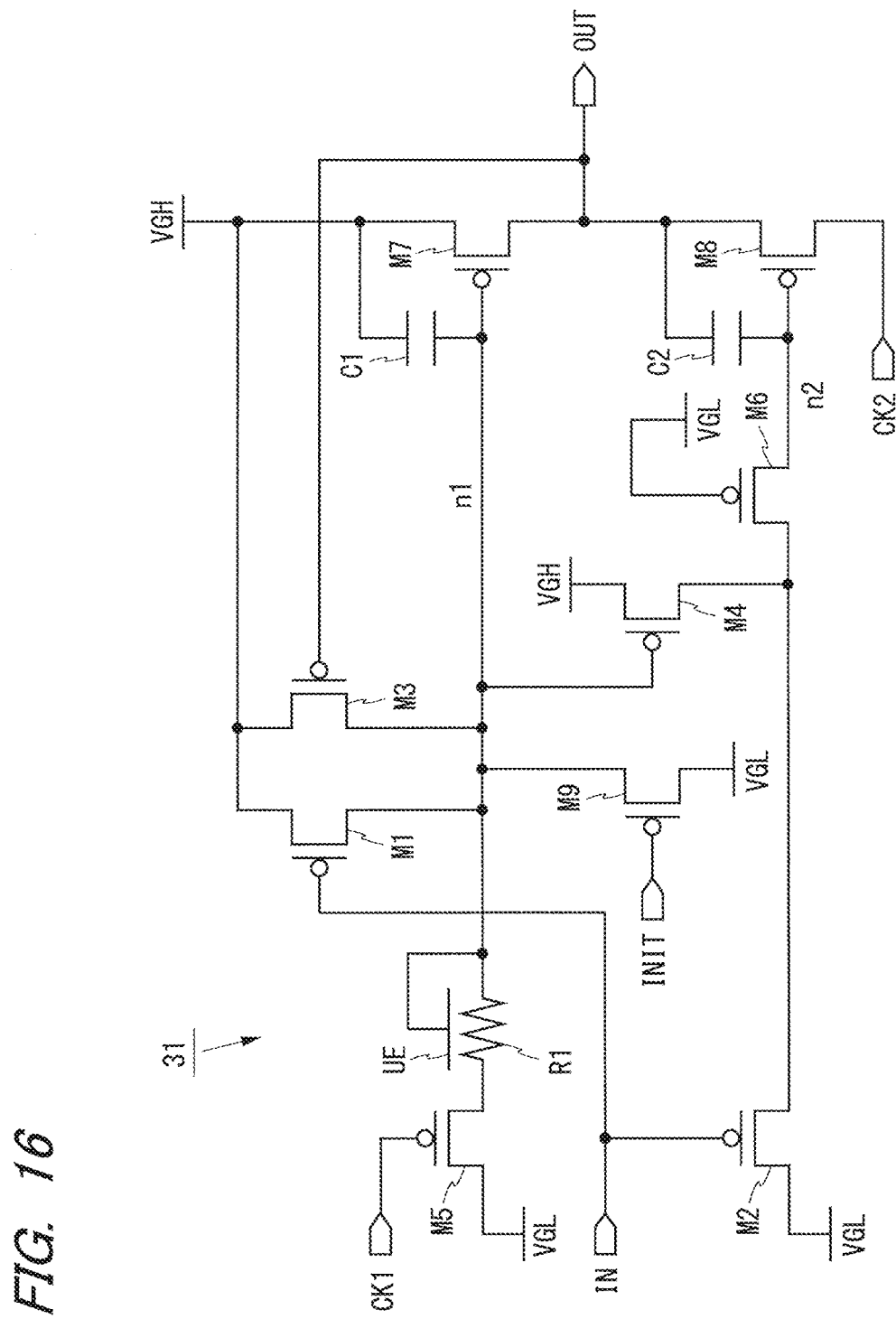
FIG. 16 is a circuit diagram for a unit circuit in a scanning-line driving circuit according to a third embodiment.

FIG. 16 is a circuit diagram for the unit circuit in the scanning-line driving circuit according to the present embodiment. In the unit circuit 31 shown in FIG. 16, the upper electrode UE formed above the resistor R1 is connected to the node n1. The node n1 is connected to the drain electrode of the TFT M1, the first terminal of the resistor R1 (right in FIG. 16), the gate electrode of the TFT M7, etc. The upper electrode UE has a voltage equal to that at the node n1.

Figure 17:
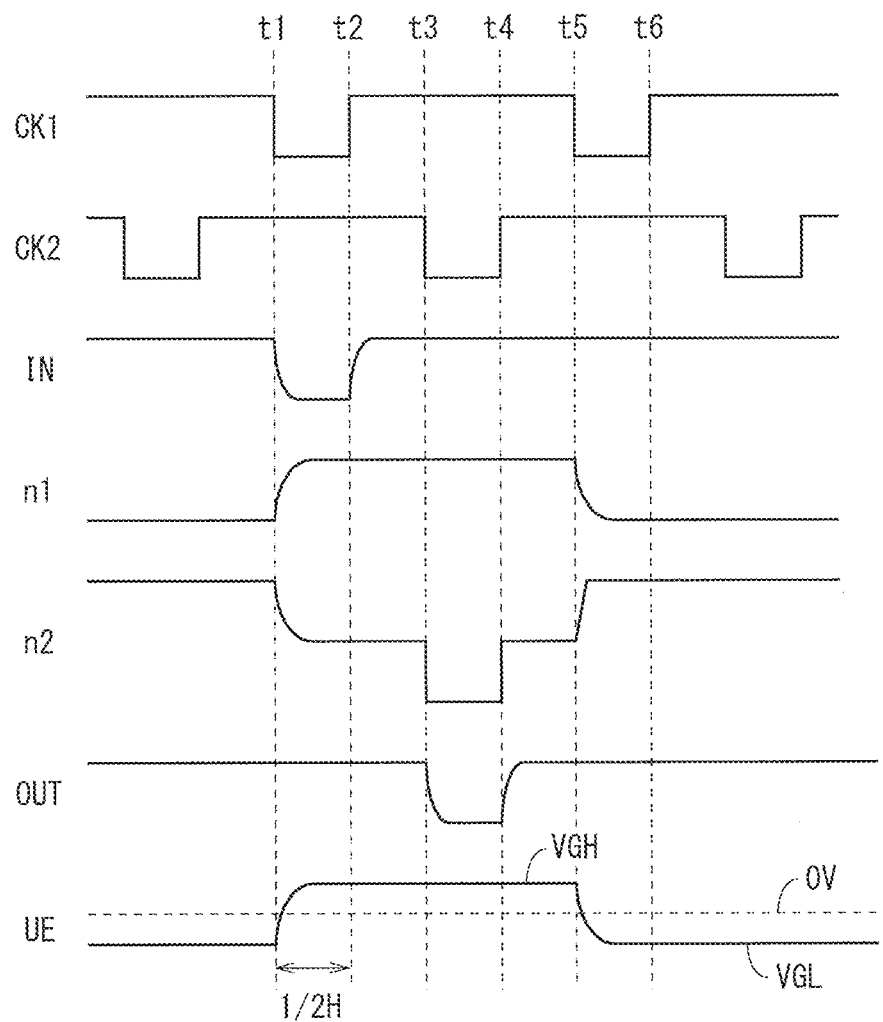
FIG. 17 is a timing chart for the unit circuit shown in FIG. 16.

FIG. 17 is a timing chart for the unit circuit 31. As shown in FIG. 17, the voltage at the upper electrode UE changes in a manner similar to the voltage at the node n1. More specifically, the voltage at the upper electrode UE transitions to high level after time t1 at which the input signal IN and the clock signal CK1 transition to low level. Moreover, the voltage at the upper electrode UE transitions to low level after time t5 at which the clock signal CK1 transitions to low level while the input signal IN is at high level. Time t1 is the time at which the unit circuit 31 starts the SET operation, and time t5 is the time at which the unit circuit 31 starts the RESET operation.

In the scanning-line driving circuit 10 according to the first embodiment, the upper electrode UE is supplied with a fixed negative voltage. Accordingly, the resistor R1 has a reduced resistance value, so that the unit circuit 11 can readily perform the RESET operation. However, reducing the resistance value of the resistor R1 makes it less easy for the unit circuit 11 to perform the SET operation. It is preferred that the resistance value of the resistor R1 be low for the RESET operation and high for the SET operation.

Therefore, in the scanning-line driving circuit according to the present embodiment, the upper electrode UE is connected to the node n1. Once the unit circuit 31 starts the SET operation at time t1, the voltage at the upper electrode UE increases to high level along with the voltage at the node n1. Accordingly, while the unit circuit 31 performs the SET operation, the upper electrode UE is supplied with a positive voltage, so that the resistor R1 increases in resistance value. As a result, the unit circuit 31 can readily perform the SET operation.

Furthermore, once the unit circuit 31 starts the RESET operation at time t5, the voltage at the upper electrode UE decreases to low level along with the voltage at the node n1.

Accordingly, while the unit circuit 31 performs the RESET operation, the upper electrode UE is supplied with a negative voltage, so that the resistor R1 decreases in resistance value. As a result, the unit circuit 31 can readily perform the RESET operation.

In the scanning-line driving circuit according to the present embodiment, the upper electrode UE is connected to the second conductive electrode of the first transistor (i.e., the drain electrode of the TFT M1) and the first node (i.e., the node n1) connected to the first terminal of the resistor R1. In the present embodiment, as in the first embodiment, the scanning-line driving circuit can prevent an operation failure due to a change in characteristics of the resistor R1. Moreover, the upper electrode UE is supplied with a positive voltage when the unit circuit 31 performs the SET operation, and is also supplied with a negative voltage when the unit circuit 31 performs the RESET operation. As a result, the unit circuit 31 can readily perform both the RESET and SET operations.

Fourth Embodiment

In a scanning-line driving circuit according to a fourth embodiment, the unit circuits 21 of the scanning-line driving circuit 20 according to the second embodiment (FIG. 13) are replaced with different unit circuits. Differences from the third embodiment will be described below.

Figure 18:
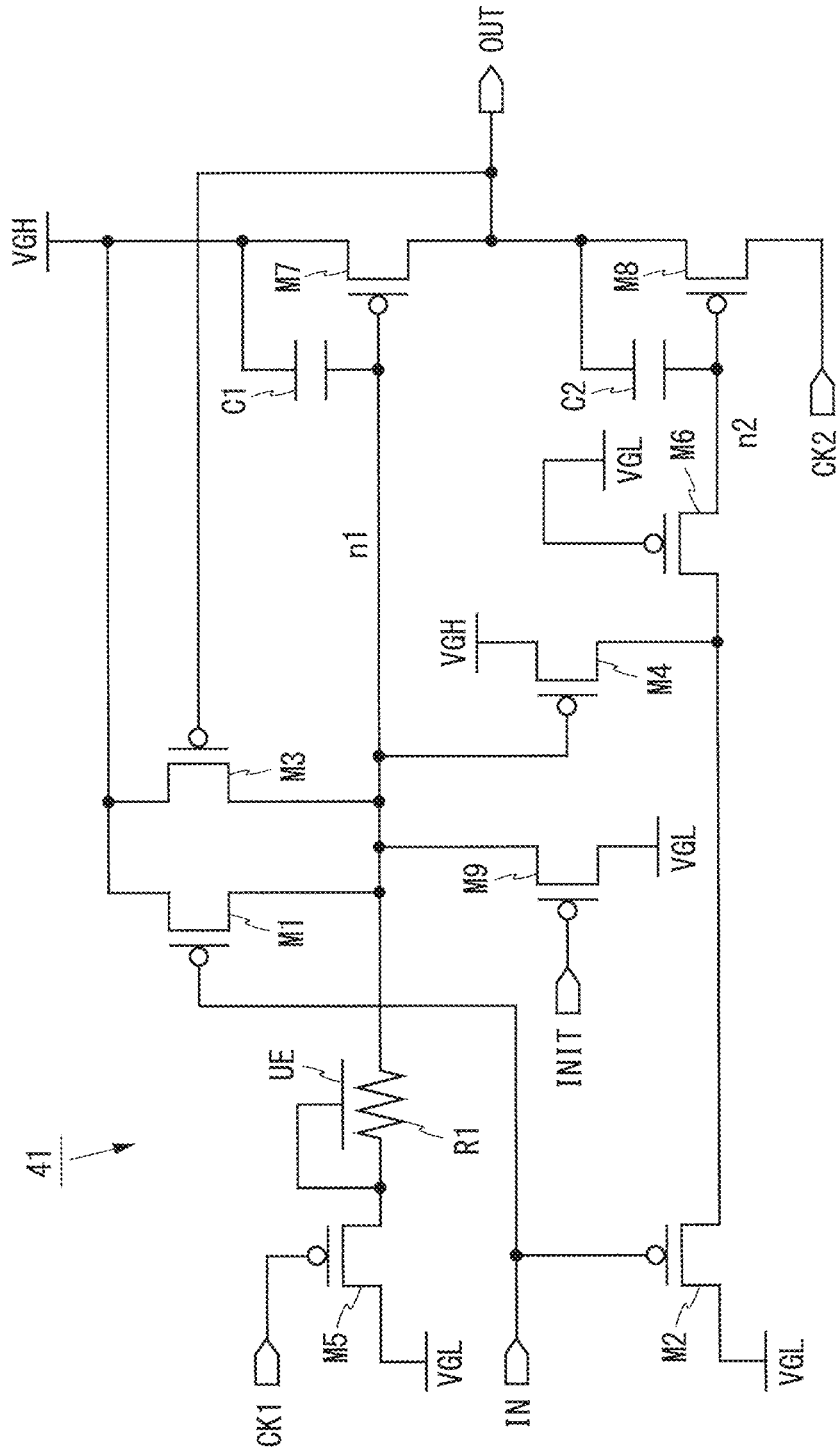
FIG. 18 is a circuit diagram for a unit circuit in a scanning-line driving circuit according to a fourth embodiment.

FIG. 18 is a circuit diagram for the unit circuit in the scanning-line driving circuit according to the present embodiment. In the unit circuit 41 shown in FIG. 18, the upper electrode UE formed above the resistor R1 is connected to the second terminal (left in FIG. 18) of the resistor R1. The second terminal of the resistor R1 is also connected to the source electrode of the TFT M5.

When the resistor R1 has no current flowing therethrough, the source electrode of the TFT M5 has a voltage equal to that at the node n1. Therefore, timing for the scanning-line driving circuit according to the present embodiment can be represented by approximately the same timing chart as shown in FIG. 17. The unit circuit 41 with the upper electrode UE connected to the second terminal of the resistor R1 operates in a manner similar to the unit circuit 31 according to the third embodiment, which has the upper electrode UE connected to the node n1.

In the scanning-line driving circuit according to the present embodiment, the upper electrode UE is connected to the second terminal of the resistor R1, and the second terminal of the resistor R1 is connected to the second conductive electrode of the second transistor (i.e., the source electrode of the TFT M5). In the present embodiment, as in the third embodiment, the scanning-line driving circuit can prevent an operation failure due to a change in characteristics of the resistor R1. Moreover, the unit circuit 41 can readily perform both the RESET and SET operations.

Fifth Embodiment

Figure 19:
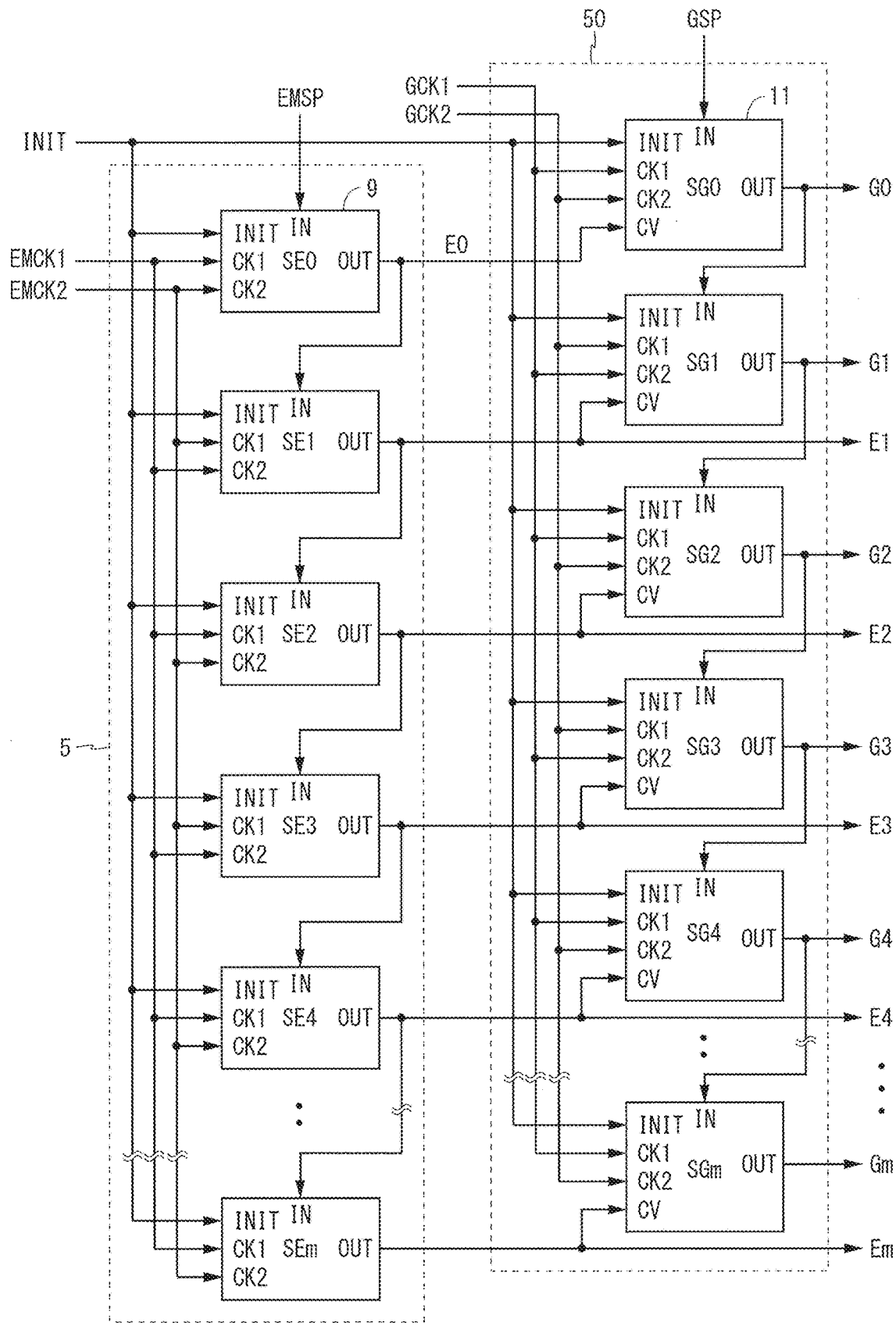
FIG. 19 is a block diagram illustrating the configuration of a scanning-line driving circuit according to a fifth embodiment.

FIG. 19 is a block diagram illustrating the configuration of a scanning-line driving circuit according to a fifth embodiment. The scanning-line driving circuit 50 shown in FIG. 19 is configured with (m+1) unit circuits 11 cascaded in stages. Differences from the first embodiment will be described below. Note that in an organic EL display device including the scanning-line driving circuit 50, the scanning-line driving circuit 50 and the emission-control-line driving circuit 5 are preferably disposed on the same side of the display portion 2.

The scanning-line driving circuit 50 receives a control signal CS1, which includes an initialization signal INIT, gate clocks GCK1 and GCK2, and a gate start pulse GSP, from the display control circuit 3. As in the first embodiment, these signals are supplied to corresponding terminals of the unit circuits 11. As in the first embodiment, the unit circuit 11 in each stage is connected at the output terminal OUT to the input terminal IN of the unit circuit 11 in the next stage and a corresponding one of the scanning lines G0 to Gm.

The emission-control-line driving circuit 5 is configured with (m+1) unit circuits 9 cascaded in stages. Each unit circuit 9 has an initialization terminal INIT, clock terminals CK1 and CK2, an input terminal IN, and an output terminal OUT. Hereinafter, the (m+1) unit circuits 9 will be referred to in order of connection as the zeroth- to m'th-stage unit circuits, and the wiring line that is connected to the output terminal OUT of the zeroth-stage unit circuit 9 will be denoted by E0.

The emission-control-line driving circuit 5 receives a control signal CS3, which includes an initialization signal INIT, emission clocks EMCK1 and EMCK2, and an emission start pulse EMSP, from the display control circuit 3. These signals are supplied to corresponding terminals of the unit circuits 9, as shown in FIG. 19. The unit circuit 9 in each stage is connected at the output terminal OUT to the input terminal IN of the unit circuit 9 in the next stage and to either the wiring line E0 or a corresponding one of the emission control lines E1 to Em. The zeroth to m'th-stage unit circuits 11 are connected at the control voltage terminals CV to the respective output terminals OUT of the zeroth to m'th-stage unit circuits 9. Accordingly, the upper electrode UE in the zeroth-stage unit circuit 11 is connected to the wiring line E0, and the upper electrode UE in the i'th-stage unit circuit 11 is connected to the emission control line Ei.

Figure 20:
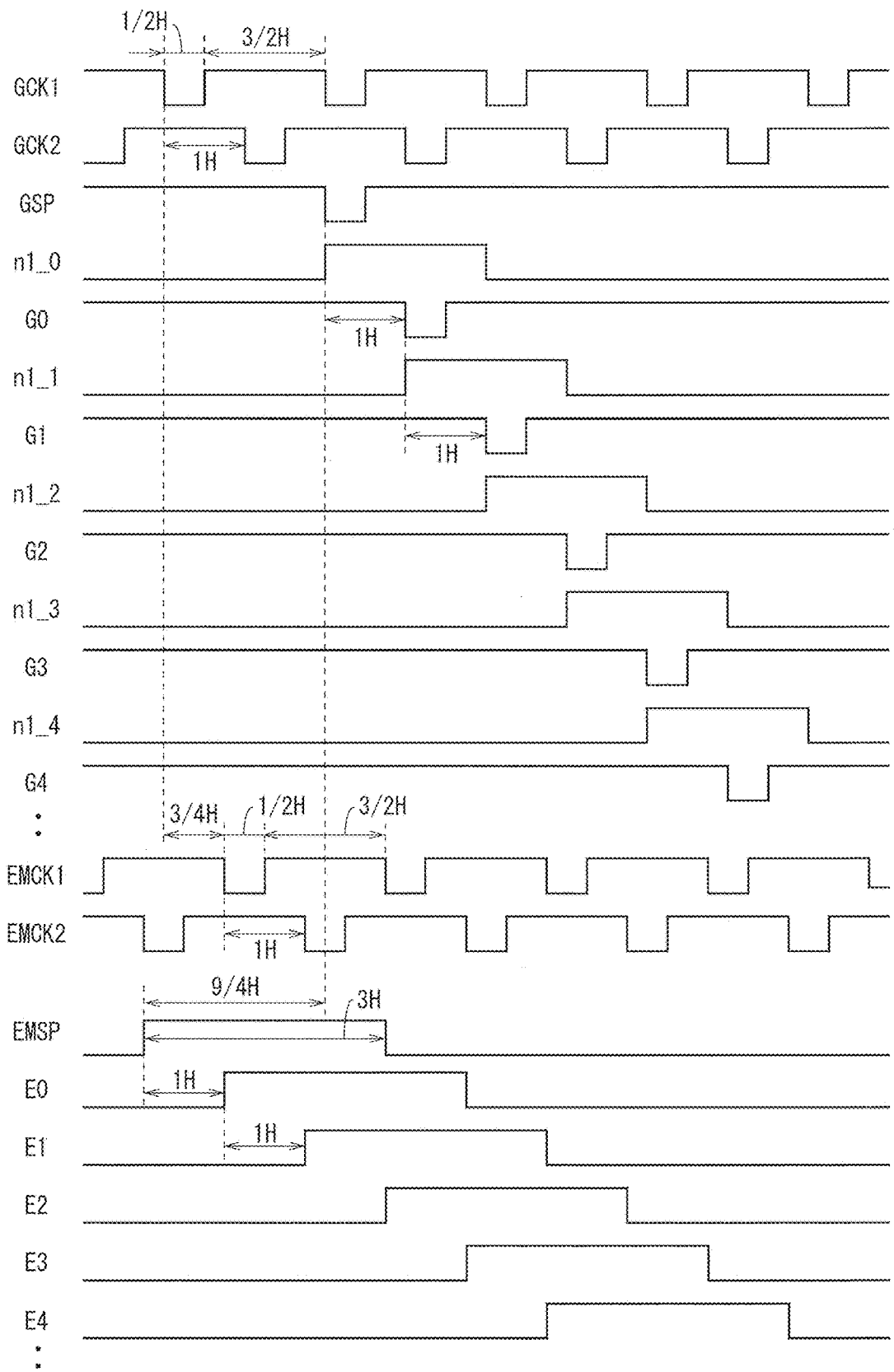
FIG. 20 is a timing chart for the scanning-line driving circuit shown in FIG. 19.

FIG. 20 is a timing chart for the scanning-line driving circuit 50. In FIGS. 20, n1_0 to n1_4 respectively denote voltages at the nodes n1 in the zeroth- to fourth-stage unit circuits 11. In FIG. 20, the gate start pulse GSP, the gate clocks GCK1 and GCK2, and the scanning lines G0 to Gm change in voltage in a manner similar to those in the timing chart shown in FIG. 4.

The emission clocks EMCK1 and EMCK2 are clock signals having a cycle of two horizontal periods. The emission clocks EMCK1 and EMCK2 have a high-level period equivalent in length to 3/2 horizontal periods and a low-level period equivalent in length to a 1/2 horizontal period. The emission clock EMCK1 is a 3/4 horizontal period behind the gate clock GCK1. The emission clock EMCK2 is one horizontal period behind the emission clock EMCK1. The emission start pulse EMSP transitions to high level 3/4 horizontal periods before the gate start pulse GSP transitions to low level. The emission start pulse EMSP remains at high level for three horizontal periods.

The unit circuit 9 changes the output signal OUT to high level when the clock signal CK1 transitions to low level while the input signal IN is at high level. The unit circuit 9 also changes the output signal OUT to low level when the clock signal CK2 transitions to low level while the input signal IN is at low level. Accordingly, the output signal OUT transitions to high level one horizontal period after the input signal and remains at high level for three horizontal periods. Therefore, the voltages on the wiring line E0 and the emission control lines E1 to Em transition to high level one after another at intervals of one horizontal period, and the voltage on each of the lines remains at high level for three horizontal periods. Similarly, the voltages on the upper electrodes UE in the zeroth to m'th-stage unit circuits 11 transition to high level one after another at intervals of one horizontal period, and the voltage on each of the upper electrodes UE remains at high level for three horizontal periods.

Figure 21:
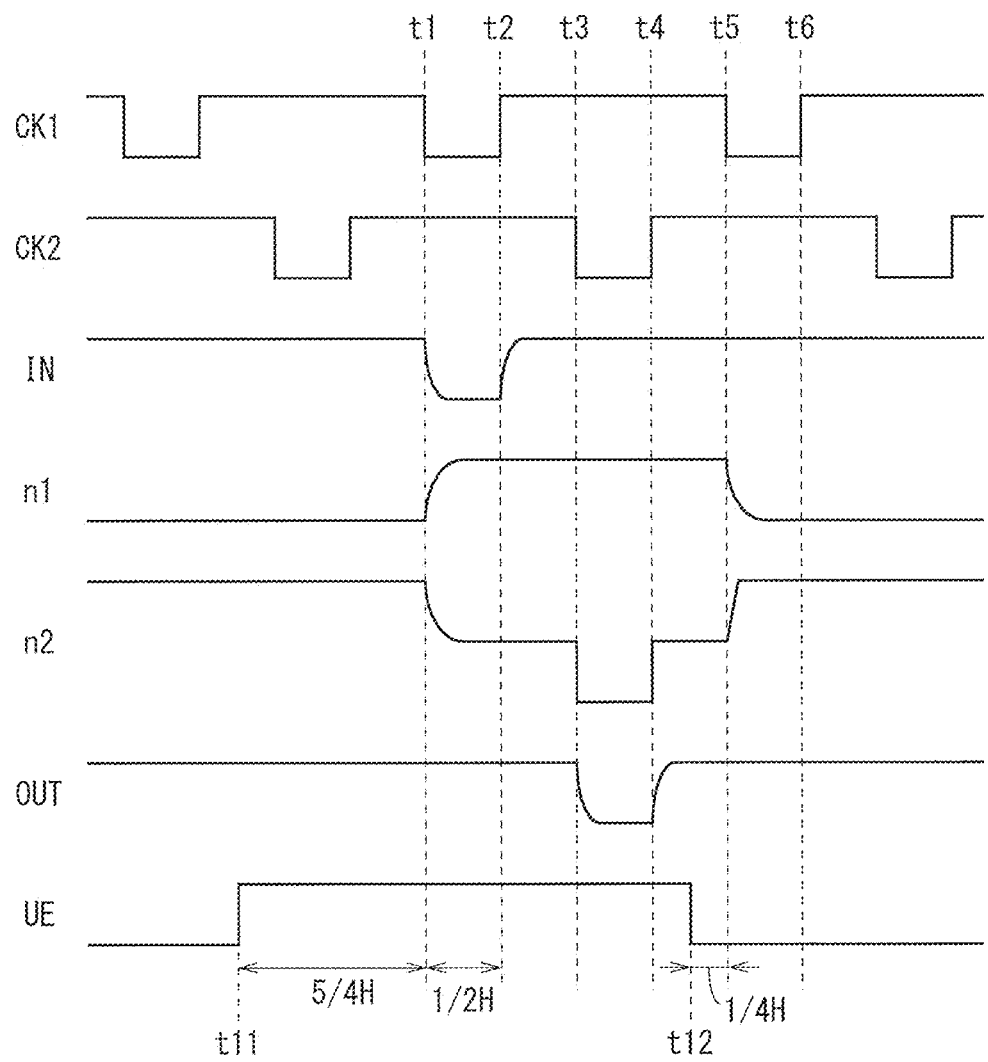
FIG. 21 is a timing chart for a unit circuit in the scanning-line driving circuit shown in FIG. 19.

FIG. 21 is a timing chart for the unit circuit 11 according to the present embodiment. As shown in FIG. 21, the voltage at the upper electrode UE transitions to high level at time t11 and to low level at time t12. Time t11 is 5/4 horizontal periods earlier than time t1 at which the input signal IN and the clock signal CK1 transition to low level. Time t12 is a 1/4 horizontal period earlier than time t5 at which the clock signal CK1 transitions to low level while the input signal IN is at high level. In this manner, the upper electrode UE is alternatingly supplied with positive and negative voltages.

The voltage at the upper electrode UE transitions to high level at time t11 before the voltage at the node n1 starts to transition from low to high level at time t1. The voltage at the upper electrode UE transitions to low level at time t12 before the voltage at the node n1 starts to transition from high to low level at time t5. Accordingly, the voltage at the upper electrode UE is at high level when the voltage at the node n1 transitions from low to high level, and also at low level when the voltage at the node n1 transitions from high to low level.

The voltage at the upper electrode UE is already at high level before the unit circuit 11 starts the SET operation at time t1. Accordingly, while the unit circuit 11 performs the SET operation, the upper electrode UE is supplied with a positive voltage, so that the resistor R1 increases in resistance value. Thus, the unit circuit 11 can readily perform the SET operation.

Furthermore, the voltage at the upper electrode UE is already at low level before the unit circuit 11 starts the RESET operation at time t5. Accordingly, while the unit circuit 11 performs the RESET operation, the upper electrode UE is supplied with a negative voltage, so that the resistor R1 decreases in resistance value. Thus, the unit circuit 11 can readily perform the RESET operation.

As described above, the scanning-line driving circuit 50 according to the present embodiment has the emission control lines E1 to Em formed on the display panel (organic EL panel 8), and each upper electrode UE is connected to a corresponding one of the emission control lines E1 to Em. The upper electrode UE is alternatingly supplied with positive (high-level) and negative (low-level) voltages, and when the voltage at the first node (node n1) transitions from the first (high) to the second (low) level, the upper electrode UE is supplied with a negative voltage. When the voltage at the first node transitions from the second to the first level, the upper electrode UE is supplied with a positive voltage.

The scanning-line driving circuit 50 according to the present embodiment, as with the scanning-line driving circuit according to the first embodiment, can prevent an operation failure due to a change in characteristics of the resistor R1. Moreover, since the upper electrode UE is supplied with a positive voltage before the unit circuit 11 starts the SET operation, and is also supplied with a negative voltage before the unit circuit 11 starts the RESET operation, the unit circuit 11 can readily perform both the RESET and SET operations. Further, the upper electrode UE is connected to the emission control line formed on the display panel (organic EL panel 8), and this simple configuration allows the upper electrode UE to be alternatingly supplied with positive and negative voltages.

Sixth Embodiment

Figure 22:
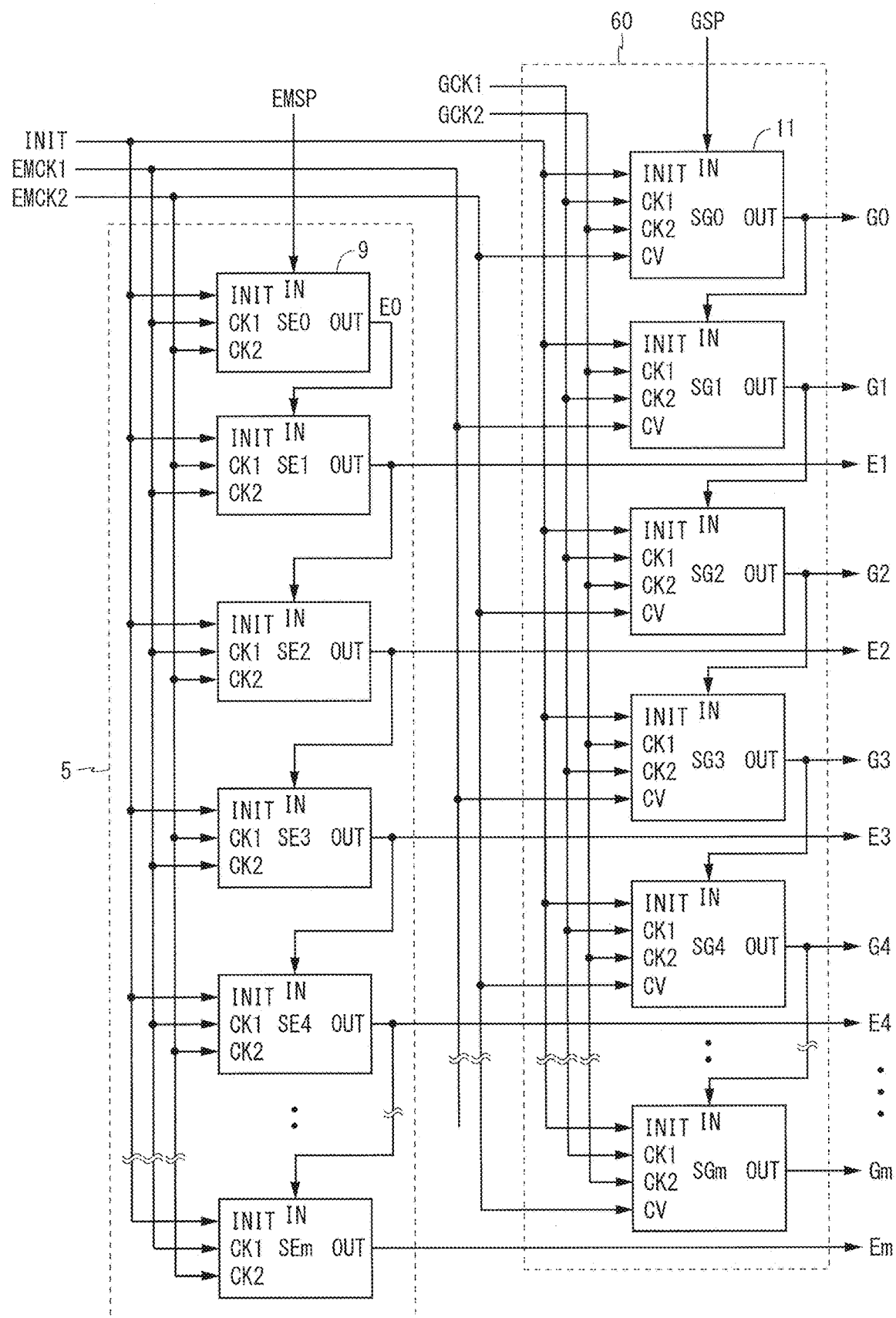
FIG. 22 is a block diagram illustrating the configuration of a scanning-line driving circuit according to a sixth embodiment.

FIG. 22 is a block diagram illustrating the configuration of a scanning-line driving circuit according to a sixth embodiment. The scanning-line driving circuit 60 shown in FIG. 22 is configured with (m+1) unit circuits 11 cascaded in stages. Differences from the fifth embodiment will be described below.

The emission-control-line driving circuit 5 shown in FIG. 22 has the same configuration as described in the fifth embodiment. The emission-control-line driving circuit 5 receives a control signal CS3, which includes an initialization signal INIT, emission clocks EMCK1 and EMCK2, and an emission start pulse EMSP, from the display control circuit 3.

In the scanning-line driving circuit 60, the control voltage terminal CV of each even-stage unit circuit 11 is supplied with the emission clock EMCK2 from the display control circuit 3. Also, in the scanning-line driving circuit 60, the control voltage terminal CV of each odd-stage unit circuit 11 is supplied with the emission clock EMCK1 from the display control circuit 3. Accordingly, the voltage at the upper electrode UE in the even-stage unit circuit 11 changes in a manner similar to the emission clock EMCK2, and the voltage at the upper electrode UE in the odd-stage unit circuit 11 changes in a manner similar to the emission clock EMCK1. Therefore, timing for the scanning-line driving circuit 60 according to the present embodiment can be represented by the same timing chart as shown in FIG. 20.

Figure 23:
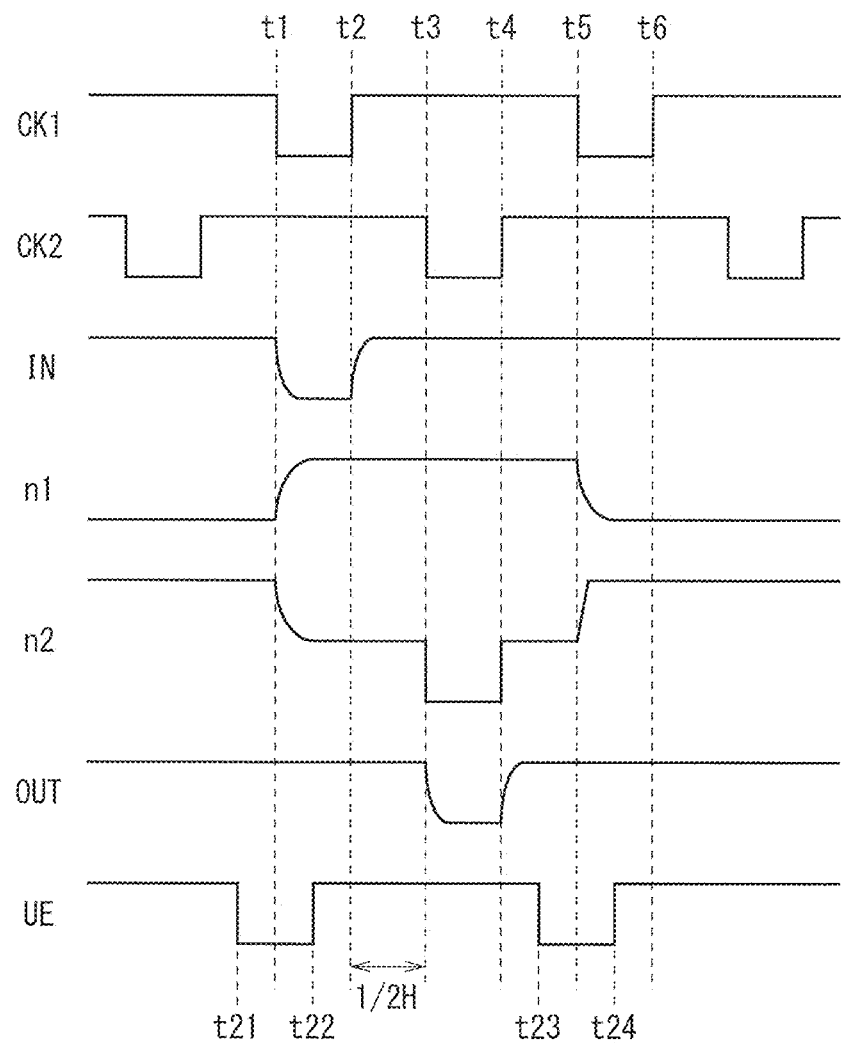
FIG. 23 is a timing chart for a unit circuit in the scanning-line driving circuit shown in FIG. 22.

FIG. 23 is a timing chart for the unit circuit 11 according to the present embodiment. As described above, the voltage at the upper electrode UE changes in a manner similar to either the emission clock EMCK1 or EMCK2. In FIG. 23, the voltage at the upper electrode UE is at low level during the period from time t21 to time t22 and the period from time t23 to time t24, and at high level during other periods. Time t21 is a 1/4 horizontal period earlier than time t1 at which the input signal IN and the clock signal CK1 transition to low level. Time t22 is a 1/4 horizontal period later than time t1. Time t23 is a 1/4 horizontal period earlier than time t5 at which the clock signal CK1 transitions to low level while the input signal IN is at high level. Time t24 is a 1/4 horizontal period later than time t5.

The voltage at the upper electrode UE transitions to low level at time t23 before the voltage at the node n1 starts to transition from high to low level at time t5. Accordingly, the voltage at the upper electrode UE is at low level when the voltage at the node n1 transitions from high to low level. That is, the voltage at the upper electrode UE is already at low level before the unit circuit 11 starts the RESET operation at time t5. Therefore, while the unit circuit 11 performs the RESET operation, the upper electrode UE is supplied with a negative voltage, so that the resistor R1 decreases in resistance value. Thus, the unit circuit 11 can readily perform the RESET operation.

It should be noted that in an organic EL display device including the scanning-line driving circuit 60, the emission-control-line driving circuit 5 does not have to be integrally formed with the organic EL panel 8. When the emission-control-line driving circuit 5 is formed independently of the organic EL panel 8, the organic EL panel 8 is simply required to have two wiring lines formed for transmitting the emission clocks EMCK1 and EMCK2 such that the wiring line that transmits the emission clock EMCK1 is connected to the control voltage terminals CV of the odd-stage unit circuits 11, and the wiring line that transmits the emission clock EMCK2 is connected to the control voltage terminals CV of the even-stage unit circuits 11.

As described above, in the scanning-line driving circuit 60 according to the present embodiment, the display panel (organic EL panel 8) has a plurality of wiring lines for transmitting a plurality of clock signals for emission control (emission clocks EMCK1 and EMCK2), and each upper electrode UE is connected to a corresponding one of the wiring lines.

The scanning-line driving circuit 60 according to the present embodiment, as with the scanning-line driving circuit according to the first embodiment, can prevent an operation failure due to a change in characteristics of the resistor R1. Moreover, the upper electrode UE is supplied with a negative voltage before the unit circuit 11 starts the RESET operation, and therefore the unit circuit 11 can readily perform the RESET operation. Further, the upper electrode UE is connected to the wiring line that is formed on the display panel (organic EL panel 8) to transmit the clock signal for emission control, and this simple configuration allows the upper electrode UE to is alternatingly supplied with positive and negative voltages.

As for the scanning-line driving circuits according to the embodiments described above, numerous variants can be configured. For example, in a scanning-line driving circuit according to a variant, the unit circuit may be differently configured so long as the unit circuit includes the first transistor, the resistor, the second transistor, and the output transistor, these transistors and resistor are connected in the mode described earlier herein, the resistor is formed in the same semiconductor layer, and the upper electrode is formed above the resistor. In a display device including the scanning-line driving circuit according to the variant, any pixel circuits may be used. In another variant, the scanning-line driving circuit may include a voltage control circuit for switching the voltage to be applied to the upper electrode UE such that the upper electrode UE is alternatingly supplied with positive and negative voltages. The voltage control circuit is configured to apply the negative voltage to the upper electrode UE when the voltage at the first node (node n1) transitions from the first (high) to the second (low) level. More preferably, the voltage control circuit is configured to apply the positive voltage to the upper electrode UE when the voltage at the first node transitions from the second to the first level. Using such a voltage control circuit also allows the unit circuit in the scanning-line driving circuit to readily perform the RESET operation (or both the RESET and SET operations).

While the display devices that include pixel circuits incorporating light-emitting elements have been described, taking as examples some organic EL display devices that include pixel circuits incorporating organic EL elements (or organic light-emitting diodes), inorganic EL display devices that include pixel circuits incorporating inorganic light-emitting diodes, QLED (quantum-dot light-emitting diode) display devices that include pixel circuits incorporating quantum-dot emission diodes, and LED display devices that include pixel circuits incorporating mini or micro LEDs may be configured in a manner similar to the display devices described above. Moreover, display devices with combined features of the above embodiments and variants may be configured by arbitrarily combining the features of the display devices described above without contradicting the nature of such combined features.

DESCRIPTION OF THE REFERENCE CHARACTERS 1 organic EL display device
2 display portion
3 display control circuit
4 data-line driving circuit
5 emission-control-line driving circuit
6 pixel circuit
7 organic EL element
8 organic EL panel
10, 20, 50, 60 scanning-line driving circuit
11, 21, 31, 41 unit circuit

The invention claimed is:

1. A scanning-line driving circuit configured with a plurality of unit circuits cascaded in stages and integrally formed with a display panel, wherein,
the unit circuit includes:
a first transistor that has a first conductive electrode supplied with a first-level voltage and a second conductive electrode connected to a first node;
a resistor connected to the first node at a first terminal;
a second transistor that has a first conductive electrode supplied with a second-level voltage and a second conductive electrode connected to a second terminal of the resistor; and
an output transistor that has a control electrode connected to the first node and a first conductive electrode connected to an output terminal,
the resistor is formed in the same semiconductor layer as semiconductor portions of the first and second transistors, and
the unit circuit further includes an upper electrode formed above the resistor.

2. The scanning-line driving circuit according to claim 1, wherein the resistor is formed with a P-type semiconductor.

3. The scanning-line driving circuit according to claim 1, wherein the upper electrode is formed in a wiring layer above control electrodes of the first and second transistors.

4. The scanning-line driving circuit according to claim 3, wherein the upper electrode is formed in the same wiring layer as wiring lines connected to the conductive electrodes of the first and second transistors.

5. The scanning-line driving circuit according to claim 3, wherein,
the display panel has anodes of light-emitting elements formed thereon, and
the upper electrode is formed in the same wiring layer as the anodes.

6. The scanning-line driving circuit according to claim 1, wherein the resistor has a resistance value of from 0.1 MΩ to 7 MΩ.

7. The scanning-line driving circuit according to claim 1, wherein the resistor and the upper electrode are intervened by an insulating film having a thickness of from 200 nm to 1 μm.

8. The scanning-line driving circuit according to claim 1, wherein,
the first transistor has a control electrode supplied with an output signal from the unit circuit in an immediately preceding stage, and
the second transistor has a control electrode supplied with a clock signal.

9. The scanning-line driving circuit according to claim 1, wherein the upper electrode is supplied with a fixed negative voltage.

10. The scanning-line driving circuit according to claim 9, wherein the negative voltage ranges from −10V to −5V.

11. The scanning-line driving circuit according to claim 9, wherein the negative voltage is equal to a low-level voltage supplied to the unit circuit.

12. The scanning-line driving circuit according to claim 1, wherein the upper electrode is connected to the first node.

13. The scanning-line driving circuit according to claim 1, wherein the upper electrode is connected to the second terminal of the resistor.

14. The scanning-line driving circuit according to claim 1, wherein,
   the upper electrode is alternatingly supplied with positive and negative voltages, and
   when the first node experiences a change from the first-level voltage to the second-level voltage, the upper electrode is supplied with the negative voltage.

15. The scanning-line driving circuit according to claim 14, wherein when the first node experiences a change from the second-level voltage to the first-level voltage, the upper electrode is supplied with the positive voltage.

16. The scanning-line driving circuit according to claim 14, wherein,
   the display panel has a plurality of emission control lines formed thereon, and
   the upper electrode is connected to a corresponding one of the emission control lines.

17. The scanning-line driving circuit according to claim 14, wherein,
   the display panel has formed thereon a plurality of wiring lines for transmitting a plurality of clock signals for emission control, and
   the upper electrode is connected to a corresponding one of the wiring lines.

18. A display device comprising a scanning-line driving circuit according to claim 1.

* * * * *